(12) United States Patent
Castro et al.

(10) Patent No.: US 8,891,280 B2
(45) Date of Patent: Nov. 18, 2014

(54) INTERCONNECTION FOR MEMORY ELECTRODES

(71) Applicant: Micron Technology, Inc., Boise, ID (US)

(72) Inventors: Hernan A. Castro, Shingle Springs, CA (US); Everardo Torres Flores, Folsom, CA (US); Stephen H. S. Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 13/651,234

(22) Filed: Oct. 12, 2012

(65) Prior Publication Data

US 2014/0104918 A1    Apr. 17, 2014

(51) Int. Cl.
*G11C 5/06*    (2006.01)

(52) U.S. Cl.
USPC ............................................. 365/63; 365/163

(58) Field of Classification Search
USPC .......................................... 365/63, 148, 163
See application file for complete search history.

(56) References Cited

U.S. PATENT DOCUMENTS

| | | | |
|---|---|---|---|
| 4,231,108 A | 10/1980 | Suzuki et al. | |
| 4,419,745 A | 12/1983 | Toyoda et al. | |
| 5,959,920 A | 9/1999 | Kiyota | |
| 6,091,620 A | 7/2000 | Kablanian | |
| 6,816,404 B2 | 11/2004 | Khouri et al. | |
| 7,453,150 B1 | 11/2008 | McDonald | |
| 2003/0002317 A1* | 1/2003 | Kang et al. | 365/145 |
| 2003/0174536 A1* | 9/2003 | Hidaka | 365/158 |
| 2011/0242885 A1 | 10/2011 | Kim | |
| 2011/0261616 A1 | 10/2011 | Kim | |

FOREIGN PATENT DOCUMENTS

EP    1237191 A2    9/2002

* cited by examiner

*Primary Examiner* — Huan Hoang

(74) *Attorney, Agent, or Firm* — Knobbe, Martens, Olson & Bear LLP

(57) ABSTRACT

Row and/or column electrode lines for a memory device are staggered such that gaps are formed between terminated lines. Vertical interconnection to central points along adjacent lines that are not terminated are made in the gap, and vertical interconnection through can additionally be made through the gap without contacting the lines of that level.

29 Claims, 15 Drawing Sheets

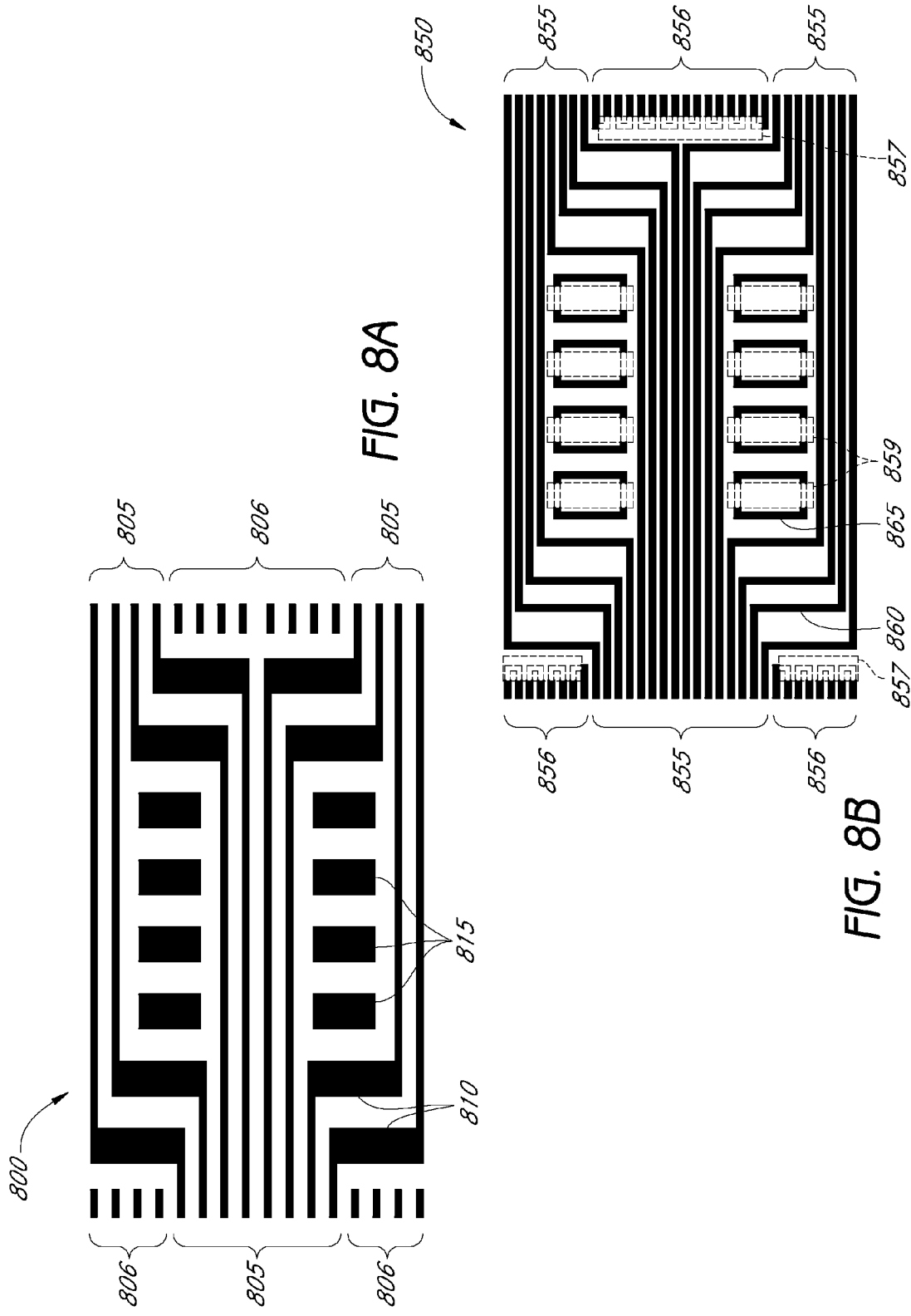

INTERCONNECTION FOR MEMORY ELECTRODES

CROSS-REFERENCE TO RELATED APPLICATIONS

This patent application is being concurrently filed with U.S. patent application Ser. No. 13/651,326, titled "METALLIZATION SCHEME FOR INTEGRATED CIRCUIT" filed on Oct. 12, 2012, by Everardo Flores et al.; and U.S. patent application Ser. No. 13/651,149, titled "MEMORY DEVICE ARCHITECTURE," filed on Oct. 12, 2012, by Hernan Castro et al.; each of which is assigned to the assignee of currently claimed subject matter and incorporated by reference in its entirety.

TECHNICAL FIELD

Embodiments of the present invention generally relate to integrated circuits and more specifically to interconnection of electrode lines for memory devices.

BACKGROUND

There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others. Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices. Various resistive memory devices can include arrays of cells organized in a cross point architecture. In such architectures, the memory cells can include a cell stack comprising a storage element, e.g., a phase change element, in series with a select device, e.g., a switching element such as an ovonic threshold switch (OTS) or diode, between a pair of conductive lines, e.g., between an access line and a data/sense line. The memory cells are located at the intersections of two conductive lines, such as a word line and a bit line, and can be "selected" via application of appropriate voltages thereto.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 8A is a plan view of a pattern of sacrificial mandrels for use in a pitch-multiplication process that can be used to create metal levels with socket locations similar to that of FIG. 7B, according to an embodiment.

FIG. 8B is a plan view of a pattern of spacers that can be formed on sidewalls of the sacrificial mandrels of FIG. 8A to form conductive lines and vertical connectors by pitch-multiplication, according to an embodiment.

Figure 1:
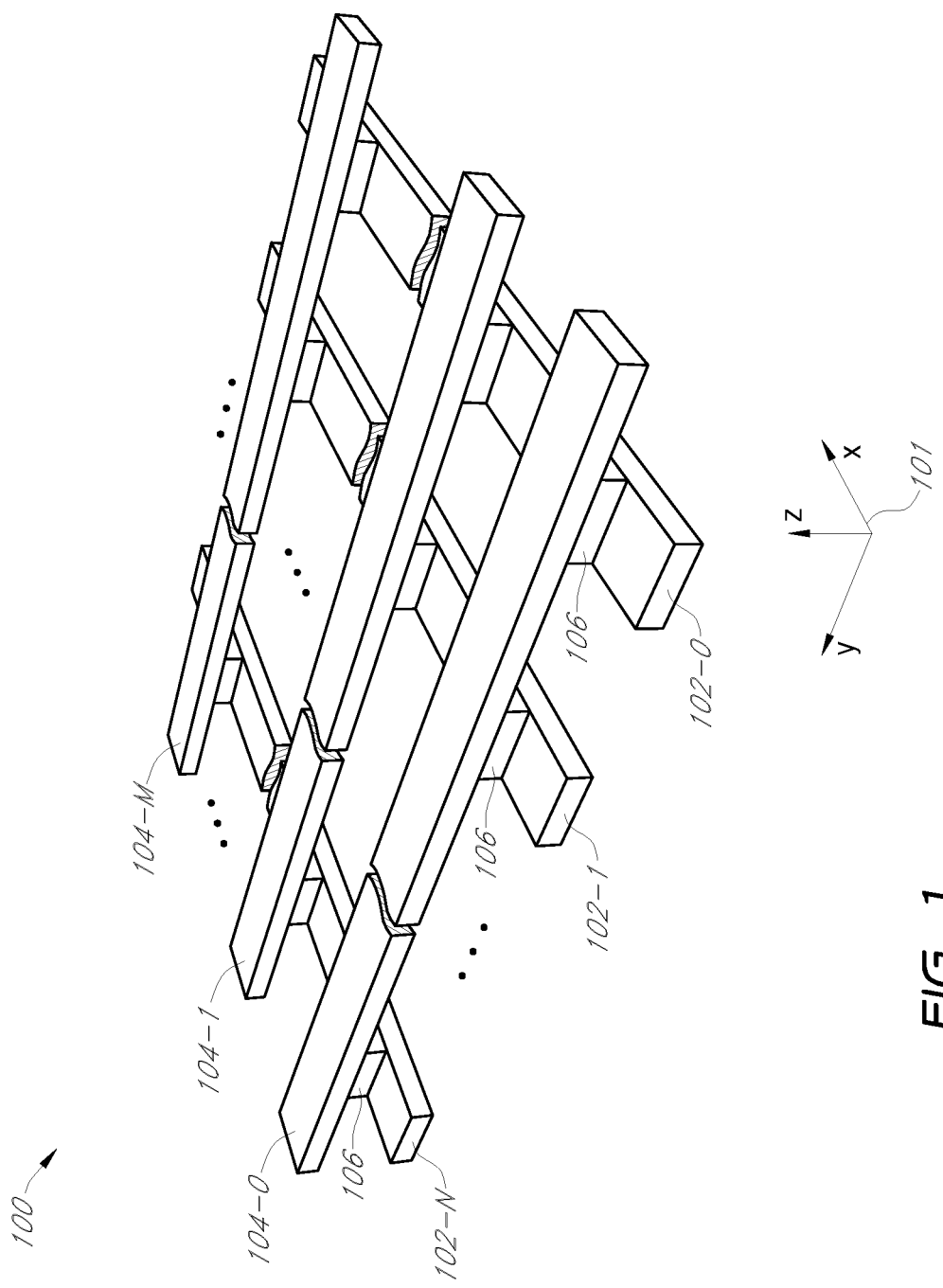
FIG. 1 is an illustration depicting a perspective view of a portion of a memory array, according to an embodiment.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and are not intended to restrict application of claimed subject matter. Therefore, the following detailed description is not to be taken to limit the scope of claimed subject matter and/or equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Integrated circuits, such as integrated circuit memory devices, include multiple layers of material typically built on a substrate. The material layers include conductive metal layers, also known as metal levels, which interconnect circuit devices. Elongate conductive lines of metal levels in an integrated circuit include interconnects as well as electrode that function as electrodes for semiconductor devices (e.g., word lines and bit lines for addressing memory cells, which can include switches and/or memory storage elements). Conductive lines formed from a layer or layers at the same vertical level can be referred to collectively as a metal level, and the lines can be referred to metal lines or wires, even though the material may be formed from non-metal conductors such as doped semiconductor layers (e.g., polysilicon) or metallic alloys such as metal nitrides, metal carbides and metal silicides. Contacts formed between metal levels can be referred to as vertical connectors. Such vertical connectors can be formed separately from the conductive lines they connect, or can be simultaneously formed with overlying conductive lines in a dual damascene process.

References herein to memory "bit lines" are more generally applicable to digit lines that are not limited to binary memory storage. Furthermore, bit lines can be referred to even more generally as column electrodes, and references to bit line drivers and driver regions herein are more generally applicable to column drivers and driver regions. Similarly, word lines can be referred to as row electrodes, and references herein to word line drivers and driver regions are more generally applicable to row drivers and driver regions. The skilled artisan will appreciate that row column electrodes need not be perpendicular; rather, an array can be configured in a manner in which the row and column electrodes cross one another at non-perpendicular angles.

In embodiments described herein, row and column driver regions (or word line and digit line driver regions) are described as including row driver circuits and column driver circuits. In addition to driver circuitry, the circuit level described below can include distributed or contiguous additional circuitry for operation of the memory array within the shared footprint with a memory array, such as global drivers, repeaters, write circuits, sense amplifiers, word decoders, digit decoders, etc. Collectively these circuits can be referred to as logic circuitry for the memory array. For example, digit line drivers, sense circuitry and digit decoders can be formed within column driver regions; word line drivers, word decoders, write circuits, global drivers and repeaters can be formed within column drivers. The skilled artisan will appreciate that different types of logic circuits can be distributed differently among the row and column driver regions described herein, and that in some embodiments the additional circuitry can be within the footprint of the memory array but outside the driver regions. Some types of logic circuitry can remain outside the footprint of the memory array.

As explained above, a memory device may include memory cells arranged in an array format. A memory array generally may include two conductive, or semi-conductive, crossing (e.g., orthogonal) lines referred to as a word line and a digit line (e.g., bit line) that are used to access, program and read a memory cell. The word lines and bit lines can also serve as electrodes for the memory cells and so can be referred to as electrode lines, or more simply as electrodes. Although different types of memory cells may be accessed, read and programmed in different manners, word lines and bit lines are typically coupled to respective word line and bit line driver circuitry, also known and row and column drivers. As used herein, the term "substrate" may include silicon-on-insulator (SOI) or silicon-on-sapphire (SOS) technology, doped and undoped semiconductors, epitaxial layers of silicon supported by a base semiconductor foundation, complementary metal oxide semiconductors (CMOS), e.g., a CMOS front end with a metal back end, and/or other semiconductor structures and technologies. Various circuitry, such as decode circuitry, for example, associated with operating memory array may be formed in and/or on the substrate. Furthermore, when reference is made to a "substrate" in the following description, previous process steps may have been utilized to form regions or junctions in the base semiconductor structure or foundation.

FIG. 1 illustrates a perspective view of a portion of a memory array 100. In this example, array 100 may comprise a cross-point array including memory cells 106 positioned at intersections of a first set of conductive lines 102-0, 102-1, . . . , 102-N, e.g., access lines, which may be referred to herein as word lines, and a second set of conductive lines 104-0, 104-1, . . . , 104-M, e.g., data lines, which may be referred to herein as bit lines. Coordinate axis 101 indicates that the bit lines 104-0, 104-1, . . . , 104-M are oriented in an y-direction and the word lines 102-0, 102-1, . . . , 102-N are oriented in a x-direction, in this example. As illustrated, the word lines 102-0, 102-1, . . . , 102-N are substantially parallel to each other and are substantially orthogonal to the bit lines 104-0, 104-1, . . . , 104-M, which are substantially parallel to each other; however, embodiments are not so limited, and word lines and bit lines can have non-perpendicular orientations. As used herein, the term "substantially" intends that the modified characteristic needs not be absolute, but is close enough so as to achieve the advantages of the characteristic. For example, "substantially parallel" is not limited to absolute parallelism, and may include orientations that are at least closer to a parallel orientation than a perpendicular orientation. Similarly, "substantially orthogonal" is may include orientations that are closer to a perpendicular orientation than a parallel orientation.

Cross-point array 100 may comprise an array structure. As an example, memory cells 106 may comprise phase change random access memory (PCRAM) cells, resistive random access memory (RRAM) cells, conductive bridge random access memory (CBRAM) cells, and/or spin transfer torque random access memory (STT-RAM) cells, among other types of memory cells. In various embodiments, memory cells 106 may comprise a "stack" structure that includes a select device, e.g., a switching device, coupled in series to a storage element, e.g., a resistive storage element comprising a phase change material or metal oxide. As an example, the select device may comprise a diode, a field effect transistor (FET), a bipolar junction transistor (BJT), or an ovonic threshold switch (OTS), among other switching elements.

In a number of embodiments, a select device and storage element associated with a respective memory cell 106 may comprise series coupled two-terminal devices. For instance, a select device may comprise a two-terminal Ovonic Threshold Switch (OTS), e.g., a chalcogenide alloy formed between a pair of electrodes, and the storage element may comprise a two-terminal phase change storage element, e.g., a phase change material (PCM) formed between a pair of electrodes. Memory cells 106 including a select device such as an OTS in series with a PCM can be referred to as phase change material and switch (PCMS) memory cells. In a number of embodiments, an electrode may be shared between a select device and a storage element of a memory cell 106. Also, in a number of embodiments, the bit lines 104-0, 104-1, ..., 104-M and the word lines 102-0, 102-1, ..., 102-N may serve as top and bottom electrodes corresponding to the memory cells 106.

As used herein, "storage element" may refer to a programmable portion of a memory cell 106, e.g., the portion programmable to different data states. For example, in PCRAM and RRAM cells, a storage element may include a portion of a memory cell having a resistance that is programmable to particular levels corresponding to particular data states responsive to applied programming signals, e.g., voltage and/or current pulses, for instance. A storage element may include, for example, one or more resistance variable materials, such as a phase change material. As an example, a phase change material may comprise a chalcogenide alloy such as an indium (In)-antimony (Sb)-tellurium (Te) (IST) material, e.g., $In_2Sb_2Te_5$, $In_1Sb_2Te_4$, $In_1Sb_4Te_7$, etc., or a germanium (Ge)-antimony (Sb)-tellurium (Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials may include transition metal oxide materials and/or alloys including two or more metals, e.g., transition metals, alkaline earth metals, and/or rare earth metals. Embodiments are not limited to a particular resistive variable material or materials associated with the storage elements of the memory cells 106. For instance, other examples of resistive variable materials that may be used to form storage elements include binary metal oxide materials, colossal magneto-resistive materials, and/or various polymer-based resistive variable materials, among others. Although not illustrated in FIG. 1, in a number of embodiments, array 100 may be implemented as part of a three dimensional (3D) architecture, with a number of arrays 100 vertically stacked on each other, for example.

Figure 2A:
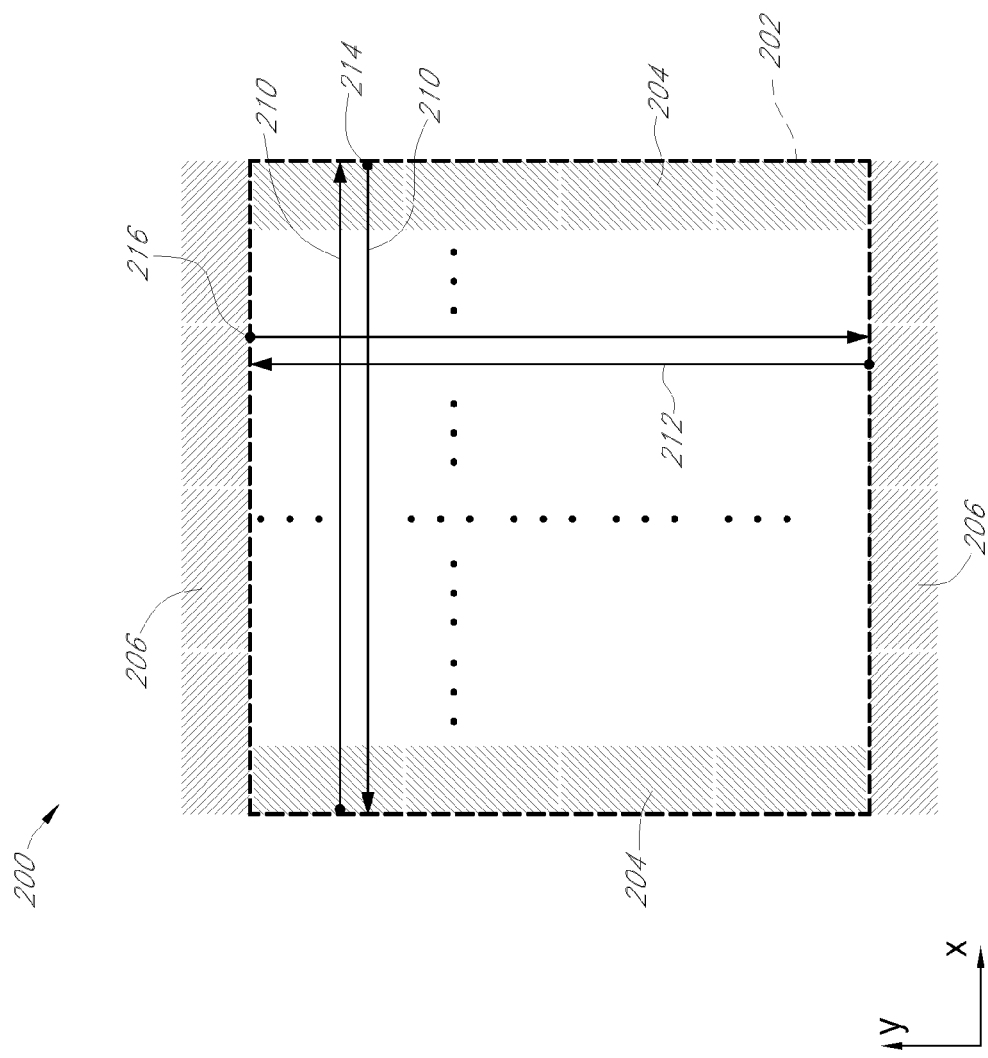
FIG. 2A is an illustration depicting a simplified plan view of a memory array architecture.

FIG. 2A is a simplified plan view of a memory array architecture 200 where word line drivers 204 are located substantially within a footprint of an active array 202, i.e., under memory cells, and near a periphery of the array. The active array 202 is outlined in FIG. 2A by the dashed outline. Bit line drivers 206, conversely, are located generally outside of the footprint of the active array 202. Inactive, dummy or filler arrays 208 (FIG. 2B) may be located outside the active array and may be placed over the bit line driver circuitry in a manufactured device. Each set of drivers 204 or 206 is located near the edge of the array 202 in two contiguous blocks of circuitry on opposite sides of the array 202. Those skilled in the art will appreciate that circuit details of the array and driver circuitry is not provided in order to focus the description on the general layout of the architecture.

Figure 2B:
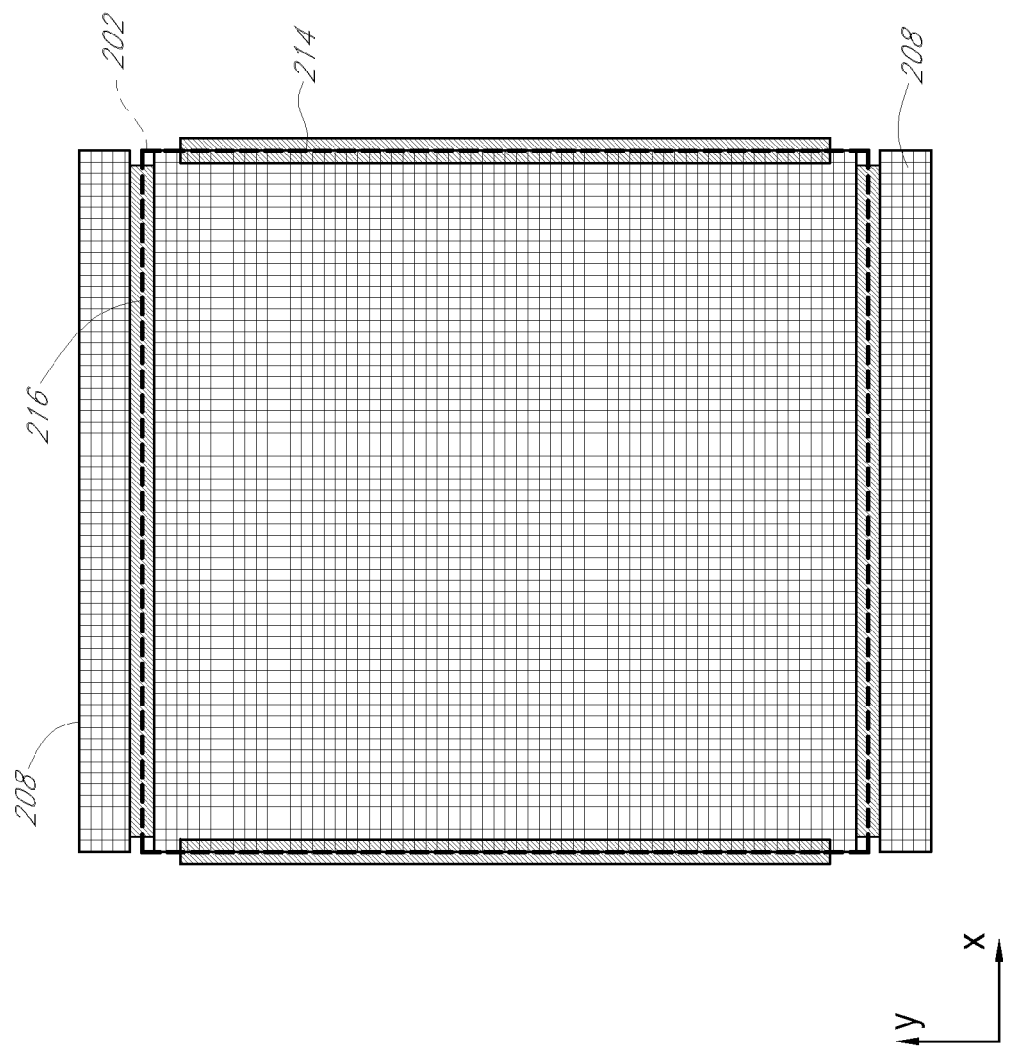
FIG. 2B is an illustration depicting general socket regions for connecting word and bit lines to their drivers at edges of an active memory array.

Word line and bit line driver circuits may be electrically coupled to word line 210 and bit line 212 conductors, respectively. Because the driver circuits are positioned alongside the array periphery, the drivers may be coupled through interconnect regions 214 and 216, which can be referred to as socket regions, to ends of the word lines and bit lines. FIG. 2B illustrates the general socket regions 214 and 216 for word and bit lines at the edges of an active array. This architecture may be simple in design but less efficient in overall die size, less efficient in the number or lithographic requirements of the interconnects employed and less efficient in terms of driver circuitry requirements as compared to the embodiments of FIGS. 3A-10, as described and explained further below.

Figure 3A:
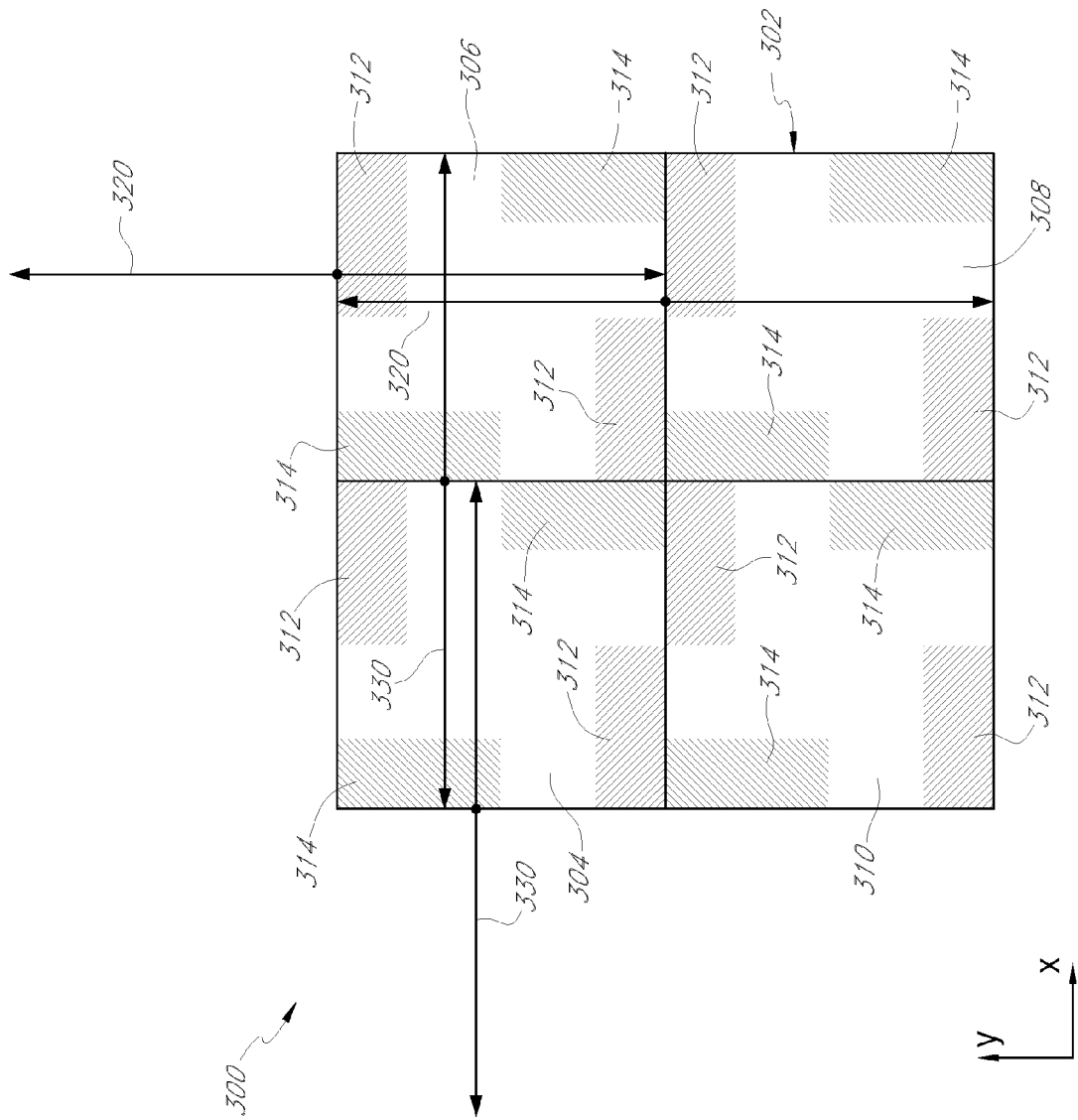
FIG. 3A is an illustration depicting an alternative memory architecture of an active memory array partitioned into multiple sub-arrays, according to an embodiment.

FIG. 3A illustrates an alternative memory architecture 300 including an active memory array 302 partitioned into multiple sub-arrays, in accordance with an embodiment. The sub-arrays are repeated in a regular fashion and so are also referred to herein as "tiles." FIG. 3A is an example of an architecture in which electrode drivers are distributed across a footprint of an active memory array. In this example, there are four sub-arrays 304, 306, 308 and 310 corresponding to one array 202 of FIG. 2A. Word line drivers 314 may be located substantially within a footprint of the active array, under the memory cells, and near the periphery of the sub-arrays. Bit line drivers 312 may also be located substantially within the footprint of the active array, under the memory cells, and near the periphery of the sub-arrays. It will be understood that each shaded area comprises a driver region that can include multiple driver circuits, and so can represent a group of drivers. In the illustrated embodiment, individual sub-array layouts in a plan view are identical to neighboring sub-arrays. That is, in this embodiment, the word line drivers 314 are in the upper left and lower right corners of the sub-arrays, and extend generally along the y-oriented edges to connect with word lines 330 that extend in the x-direction. The row driver regions, represented by the word line drivers 314 in FIG. 3A, are elongated in the column or y-direction.

Word line drivers 314 may be coupled to central locations along the word lines 330, which may cross boundaries between adjacent sub-arrays, and may also cross boundaries of other driver regions. As indicated by a dot along each word line 330, the connection point, also known as a socket, between the word line 330 and its driver is positioned centrally along the word line, rather than at an end of the word line. In some implementations, the connection point (socket) is closer to a mid-point along the word line 330 than to either end point of the word line 330. In some implementations, the connection point (socket) is positioned a distance of at least about 40% of the length of the word line 330 from either end of the word line 330, such that the connection point is within the middle 20% of the length of the line. The word lines 330 can have generally the same length as the word lines of FIG. 2A. That is, the total number of bits coupled to a physical word line may be the same for internally (FIG. 3A) or peripherally (FIG. 2A) connected word lines, although the distance to the terminal point of the word line from the driver interconnect is reduced. For example, each word line 330 can serve about 1000-4000 bits for current technology nodes.

The bit line drivers 312 are in the upper right and lower left corners of the sub-arrays of FIG. 3A, and extend generally along the edges along the x-direction to connect with bit lines 320 that extend in the y-direction. The column driver regions, represented by the bit line drivers 312 in FIG. 3A, are elongated in the row or x-direction. Similar to the word line drivers, the bit line drivers 312 may be coupled to a central location of the bit lines 320, which cross boundaries between adjacent sub-arrays. As indicated by a dot along each bit line 320, the connection point between the bit line 320 and its driver is positioned centrally along the bit line, rather than at an end of the bit line. In some implementations, the connection point is closer to a mid-point along the bit line 320 than to either end point of the bit line 320. In some implementations, the connection point (socket) is positioned a distance of at least 40% of the length of the bit line 320 from either end of the bit line 320, such that the connection point is within the middle 20% of the length of the line. The bit lines 320 can have generally the same length (number of bits) as the bit lines 212 of FIG. 2A. It will be appreciated by those skilled in the art that the driver circuits can be reversed, for example the word line drivers can be in the lower left and upper right corners of the sub-arrays. In FIG. 3A each of the sub-arrays has the same layout.

In FIG. 3A, word lines 330 are shown as staggered, i.e., adjacent words lines 330 are shifted with respect to one another along their axis of elongation (x-axis). It will be understood from the further description below that a group of word lines 330 can be co-extensive with one another and staggered with respect to adjacent groups of words lines 330 (see, e.g., FIGS. 7B and 8B and attendant description). Similarly, bit lines 320 or groups of bit lines 320 are staggered in the architecture of FIG. 3A.

Figure 3B:
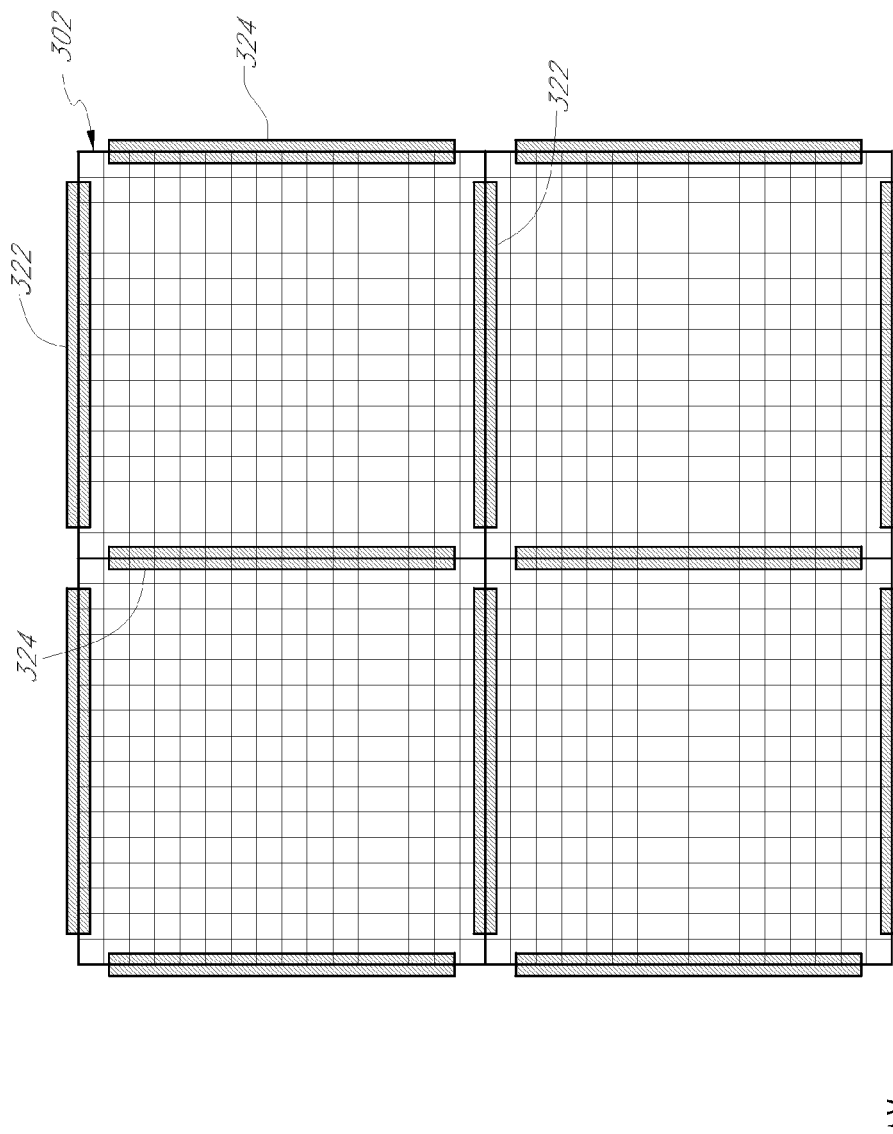
FIG. 3B is an illustration depicting example socket interconnect regions for connecting word lines and bit lines of FIG. 3A to their drivers.

FIG. 3B illustrates socket interconnect regions 324 for the word lines and socket interconnect regions 322 for the bit lines of the array architecture of FIG. 3A. It is noted that the socket regions are at the boundaries of the sub-arrays. By breaking the word and bit line driver groups and socket regions into smaller pieces and staggering the lines 320 and 330, or groups of lines, in alternate rows, as illustrated in FIG. 3A, the bit lines 320 and word lines 330 can extend through the active array 302 and through the socket regions 322 and 324. Accordingly, neither the socket regions nor the driver locations are restricted to the array edges as in FIG. 2B.

Figure 4A:
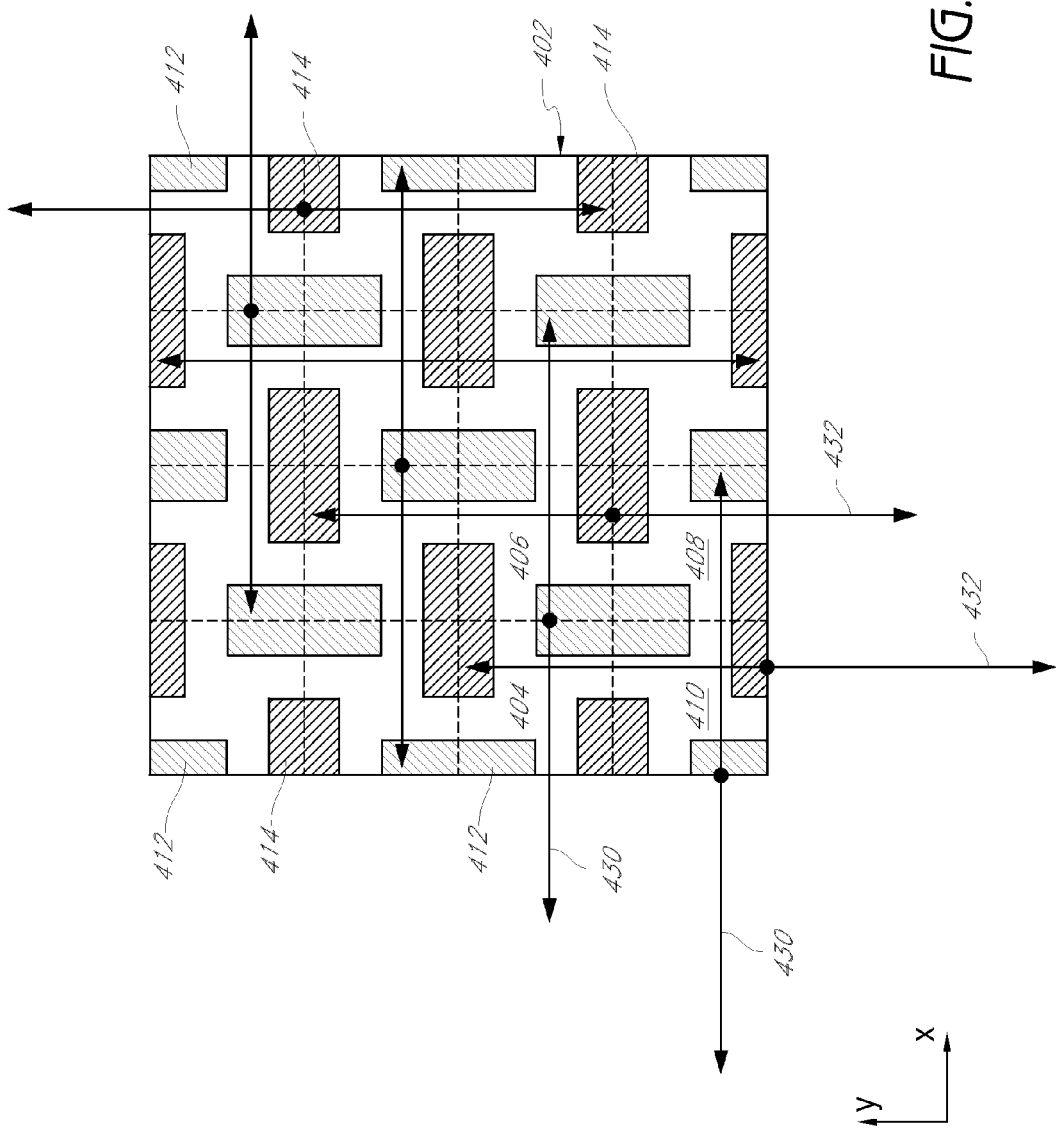
FIG. 4A is an illustration depicting an alternative memory architecture of an active memory array partitioned into multiple sub-arrays, according to an embodiment.

FIG. 4A illustrates an alternative memory architecture 400 where the active memory array 402 is partitioned into multiple sub-arrays. In this example, there are four sub-arrays 404, 406, 408 and 410 occupying the same footprint as one sub-array 304 of FIG. 3A. Each of the smaller sub-arrays 404-410 can be referred to as "patches" and together they can define the larger repeating unit of a tile. FIG. 4A is another example of an architecture in which electrode drivers are distributed across a footprint of an active memory array. Like FIG. 3A, the row drivers, represented by word line drivers 412 in FIG. 4A are elongated in the column or y-direction, while the column drivers, represented by bit line drivers 414 in FIG. 4A, are elongated in the row or x-direction. A signal path traversing a path in an x- or y-direction may alternately pass over row and column driver regions.

Word line drivers 412 may be located substantially within the footprint of the active array and near the periphery of the sub-arrays. Bit line drivers 414 may also be located substantially within the footprint of the active array and near the periphery of the sub-arrays. It will be understood that each shaded area comprises a driver region that can include multiple driver circuits, and so can represent a group of drivers. In the illustrated embodiment, individual sub-array layouts in a plan view may be mirror copies of layouts of adjacent sub-arrays. That is, in sub-array 404 the word line drivers 412 are in the upper left and lower right corners of the sub-array, and extend generally along the edges extending in the y-direction of the subs-array to connect with word lines 430 extending in the x-direction.

The word line drivers 412 may be coupled to a central location of the word lines 430, as explained for the socket location along word lines 330 of FIG. 3A. Word lines 430 may cross boundaries between adjacent sub-arrays and may also cross boundaries of other driver regions. The bit line drivers 414 are in the upper right and lower left corners of sub-array 404, and extend generally along the edges extending in the x-direction of the sub-array to connect with bit lines 432 extending in the y-direction.

It is noted that the bit line drivers 414 are coupled to a central location of the bit lines 432, as explained for the socket locations along bit lines 320 of FIG. 3A. Bit lines 432 may cross boundaries between adjacent sub-arrays and may also cross boundaries of other driver regions. In adjacent sub-array 406 the word line drivers 412 are in the lower left and upper right corners of the sub-arrays, and extend generally along the edges extending in the y-direction to connect with word lines 430 extending in the x-direction. The bit line drivers 414 are in the lower right and upper left corners of the sub-arrays, and extend generally along the x edges to connect with bit lines 432 extending in the y-direction. Thus in a plan view the layout of the drivers is a mirror image between adjacent sub-arrays 404 and 406.

As in FIG. 3A, both word lines 430, or groups of word lines, and bit lines 432, or groups of bit lines, are staggered in the architecture of FIG. 4A. Unlike FIG. 3A there are now four levels of staggering for each word line or group of word lines and each bit line or group of bit lines in the illustrated tile. The period represented by the group of four word lines 430 can be repeated in tile adjacent in the y-direction, and the period represented by the group of four bit lines 432 can be repeated in the tiles adjacent in the x-direction.

Figure 4B:
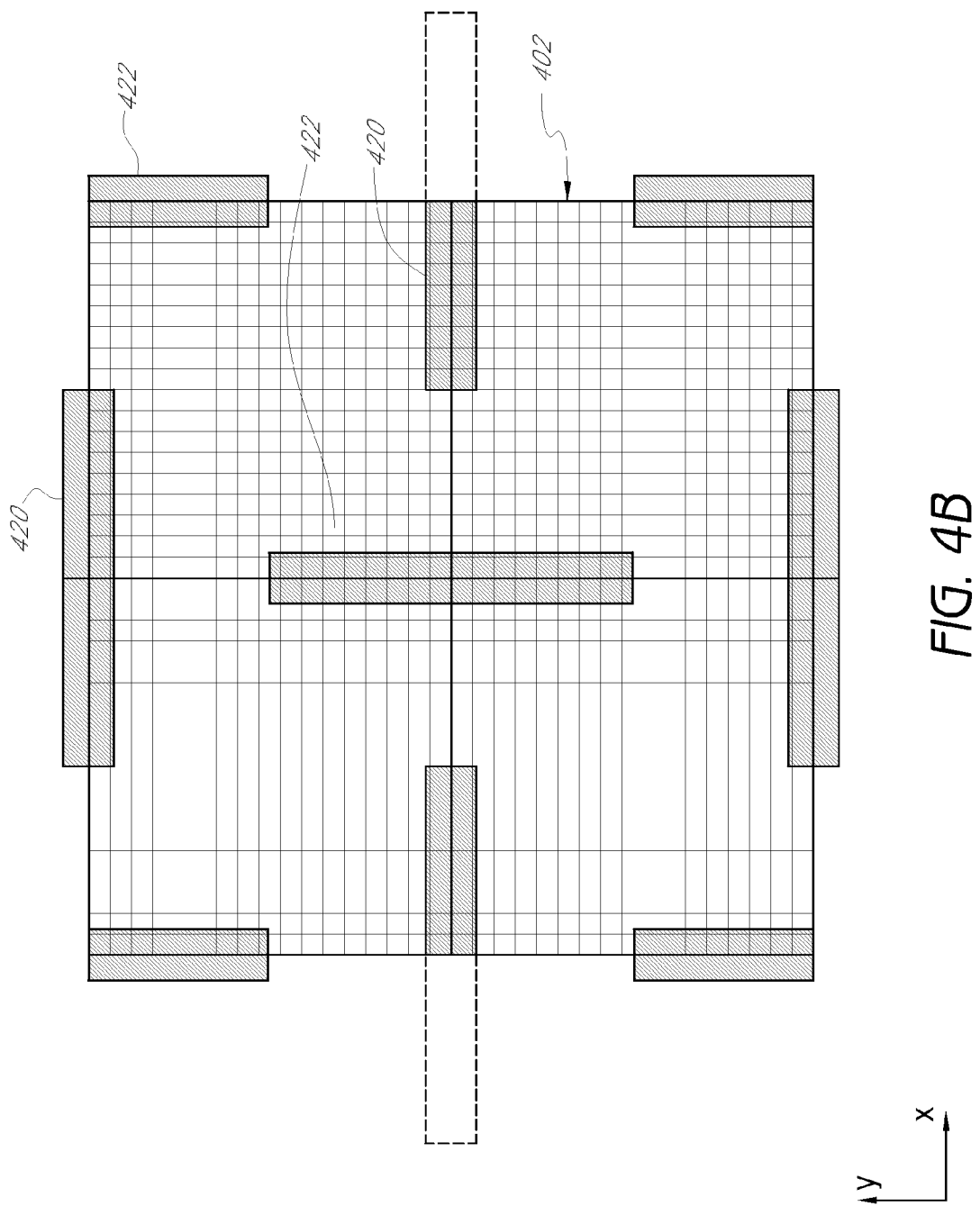
FIG. 4B is an illustration depicting socket interconnect regions for connecting word lines and bit lines of FIG. 4A to their drivers.

FIG. 4B illustrates the socket interconnect regions 420 for bit lines and socket interconnect regions 422 for word lines, of the array architecture of FIG. 4A. Only four of the sub-arrays of FIG. 4A are shown. It is noted that the socket regions are at the boundaries of the sub-arrays. By breaking the word and bit line driver regions and socket regions into smaller segments and staggering the lines or groups of lines in alternate rows, as illustrated in FIG. 4A, the word lines and bit lines can extend through the active array 402 and through the socket regions 420 and 422. Accordingly, neither the socket regions nor the driver regions are restricted to the array edges as in FIG. 2B. Further, the pattern of the socket regions is different from FIG. 3B due to the mirror pattern of the adjacent sub-arrays.

One skilled in the art will recognize that locating the word and bit line drivers is more than mere design choice. Location for the driver circuitry affects performance of the memory and requires substantial architectural changes, as explained below, in the array and metallization layers.

For the particular organization of array drivers and array interconnection points (sockets) in FIG. 4A, substantial cost reduction can be obtained in the driver (e.g., CMOS) circuitry to drive the array as well as the metal level connections from the driver circuitry to the array of memory cells. FIG. 3A has an advantage of being able to fit all drivers under the array, sharing the same footprint as memory cells in a densely packed manner, as compared to the arrangement of FIG. 2A. The embodiment of FIG. 3A places all drivers under the array by breaking up the driver groups into smaller pieces and locating the sockets in a distributed manner as compared to the FIG. 2A. This also enables the array word lines and bit lines, which also serve as electrodes for the array, to be driven from their midpoints. Driving the electrodes from their midpoints confers advantages to the drivers due to reduction in IR drop and RC delay as compared to the arrangement of FIG. 2A, because the farthest cell along the line is about half the distance as for the farthest cell in the arrangement of FIG. 2A, which can be of significant benefit to certain types of cross-point memory cell technologies. This benefit may be manifested in relaxed transistor requirements, circuit complexity, process complexity or circuit area for the driver circuits, as examples.

The architecture of FIG. 4A further dissects the driver groups and socket regions into yet smaller pieces. It retains the advantages of centrally driven electrodes and uses a socket to support such connections. In addition, the architecture of FIG. 4A also centers the driver groups (regions) with respect to their sockets, which can be understood by comparing the socket locations in FIG. 3A (dots along the electrode lines are at the edges of the driver regions 312 and 314) with the centered socket locations of FIG. 4A (dots along the electrode lines are in the middle of the driver regions 412 and 414. This has the additional advantage of reducing the interconnection requirements from driver to socket. This reduced interconnection requirement may manifest itself as a relaxed pitch requirement on interconnect metal layers, or a reduction in the number of interconnect metal layers, with a significant cost advantage, as compared with the less distributed arrangements of FIG. 2A or FIG. 3A.

Yet another feature of the architecture of FIG. 4A is enabled by the placement of the socket regions for crossing (e.g., orthogonal) conductors, in such a way that they never touch each other. Placing of the socket regions for orthogonal conductors in a disjointed pattern allows the layout of the driver groups to be simplified, since in many memory technologies the drivers of orthogonal electrodes are designed to employ different transistor types or materials that should be kept separate from each other. Another feature of the disjointed arrangement of socket regions for orthogonal conductors is that anytime a memory cell is accessed by the selection of a word line electrode and a bit line electrode, the worst case and best case distance of that particular cell from its socket is never the worst case or best case of any two electrodes. As an example, if a memory cell along a word line is farthest away from its socket, its corresponding bit line location cannot also be farthest away from its bit line socket. The same is true of the memory cell along a word line that is closest to its word line socket. This can be a significant performance advantage for memory technologies where that combined distance, which translates into a larger IR drop or longer RC delay, may impact the size of array or limit the operating conditions of the memory device. This advantage may alternatively be manifested by further relaxation of driver specifications, such as circuit area, circuit complexity and process complexity as examples.

Although not illustrated, it will be apparent to one skilled in the art with the benefit of the present disclosure that interconnecting with a central point along the word line and bit line electrodes along with the disjointed socket region organization can reduce the area required per circuit driver due to relaxed driver specifications by reduction in distance along the conductors from the socket to the farthest cell. The individual number of contiguous segments of socket interconnect regions is larger as compared with a single ended socket implementation, and thus may have larger overhead, but this overhead is more than compensated by being able to fit all drivers under the array and the reduced driver area required. The area under the active array made available by the relaxed specification for the array drivers can be used by other circuitry which can leverage the more efficient interconnect routes enabled by the socket regions within the active array and within the driver groups.

An advantage of cross-point memory devices is the ability to "stack" multiple memory cells on top of each other. Because the memory cells are located at intersections of word and bit lines, by providing additional word and/or bit lines the density of the memory array can be increased. Each layer of memory cells can be referred to as a deck. For a two deck memory array a bit line layer can be sandwiched between two word line layers. As such, in a two deck memory device the number of word line drivers is doubled thereby increasing the die area occupied by word line drivers.

Figure 9B:
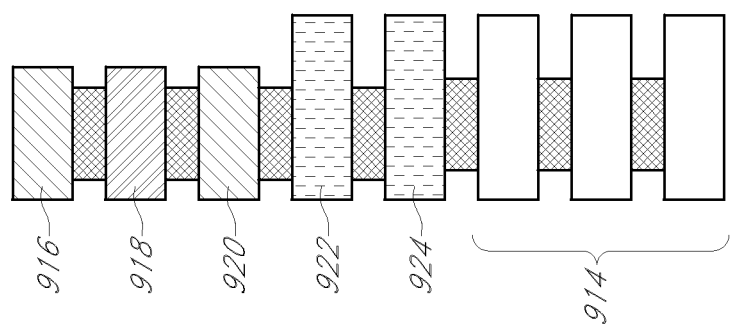
FIG. 9B is an illustration depicting multiple levels of a memory device, including two word line layers sandwiching a bit line layer in a memory array, according to an embodiment.
Figure 9A:
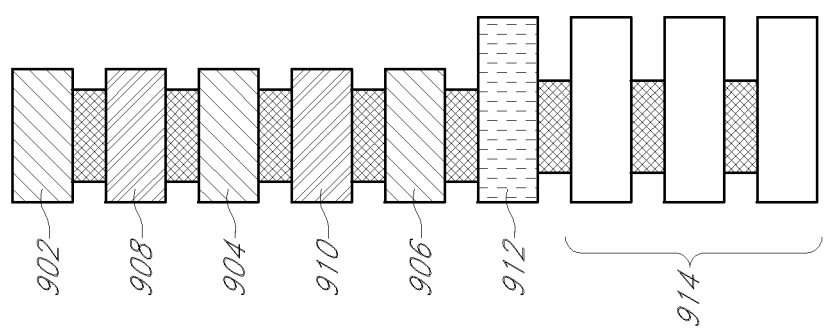
FIG. 9A is an illustration depicting multiple levels of a memory device, including three word line layers alternated with two bit line layers in a memory array, according to an embodiment.

With reference to FIG. 9A, which schematically shows metal levels of a multi-deck memory device. In one implementation, a four deck memory array has three word line layers alternated with two bit line layers. The memory includes word lines layers 902, 904 and 906, bit line layers 908 and 910, a "glue" layer G1 912 and three layers of metal 914 (M1, M2 and M3). All of the illustrated layers can be referred to as metal levels, including both interconnect layers 912-914 and electrode layers 902-910.

For clarity of description, the glue layer 912 is provided with a separate label from the other interconnect metal layers 914 of M1, M2 and M3 and is treated as a separate class of interconnect herein. The function of the glue layer 912 is to carry out the connections between the array (represented by metal layers 902-910 in FIG. 9A) and the lower layers of the driver circuits (represented by metal layers 914 in FIG. 9A). However, the glue layer can be a patterned metal layer, like the other metal layers. Moreover, the function of the glue layer may alternatively be embedded in the lower layers by appropriate modifications of these layers. Similarly the bit lines and word lines 902-910 can be referred to as "electrodes" or "electrode lines" simply to distinguish metal lines that form part of the memory array and function as electrodes therein from lower level interconnects 914 that serve to connect semiconductor devices. Like the glue layer and other metal layers of FIG. 9A, however, these lines can be patterned metal lines. M1 can serve as a local interconnect and for strapping semiconductor diffusion regions, whereas M2 and M3 can serve as longer distance interconnects.

The top and bottom word lines 902 and 906 can be shorted together and driven by a common driver circuit. As such, in a four deck memory device the number of word line drivers and bit line drivers are doubled relative to a single deck memory device occupying the same footprint, thereby increasing the die area to be occupied by the drivers.

Figure 9C:
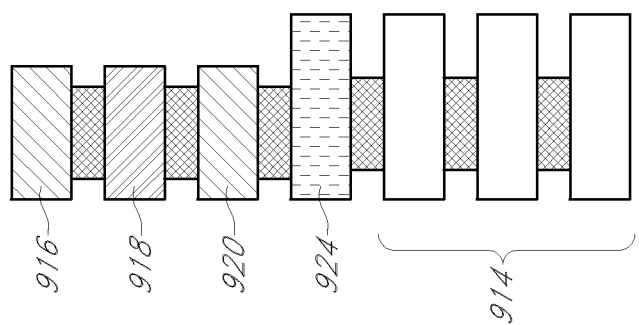
FIG. 9C is an illustration depicting multiple levels of a memory device, including two word line layers sandwiching a bit line layer in a memory array, according to an embodiment.

For comparison, assuming three metal layers 914 are employed at the lower levels, the architectures of FIGS. 2A and 3A may entail two interconnect glue layers in a two deck memory array. FIG. 9B generally illustrates these interconnect layers. The memory includes word lines layers 916 and 920, bit line layer 918, glue layers 922 and 924 and three additional layers of interconnect metal 914 (M1, M2 and M3) for a total of five interconnect layers below the array. In contrast, the architecture of FIG. 4A can employ only one glue layer for either the two deck (FIG. 9C) or four deck (FIG. 9A) devices. This advantage of reducing one interconnect glue layer is possible because of the centered placement of sockets within the driver groups. FIG. 9C generally illustrates the interconnect layers for a two deck memory array overlying drivers arranged according to the embodiment of FIG. 4A. The memory includes word lines layers 916 and 920, bit line layer 918, a glue layer 924 and three layers of metal 914 (M1, M2 and M3), for a total of only four interconnect layers below the array. The skilled artisan will appreciate that each level of metal can entail one or more depositions and one or more lithographic steps, depending upon processing techniques employed.

Figure 5:
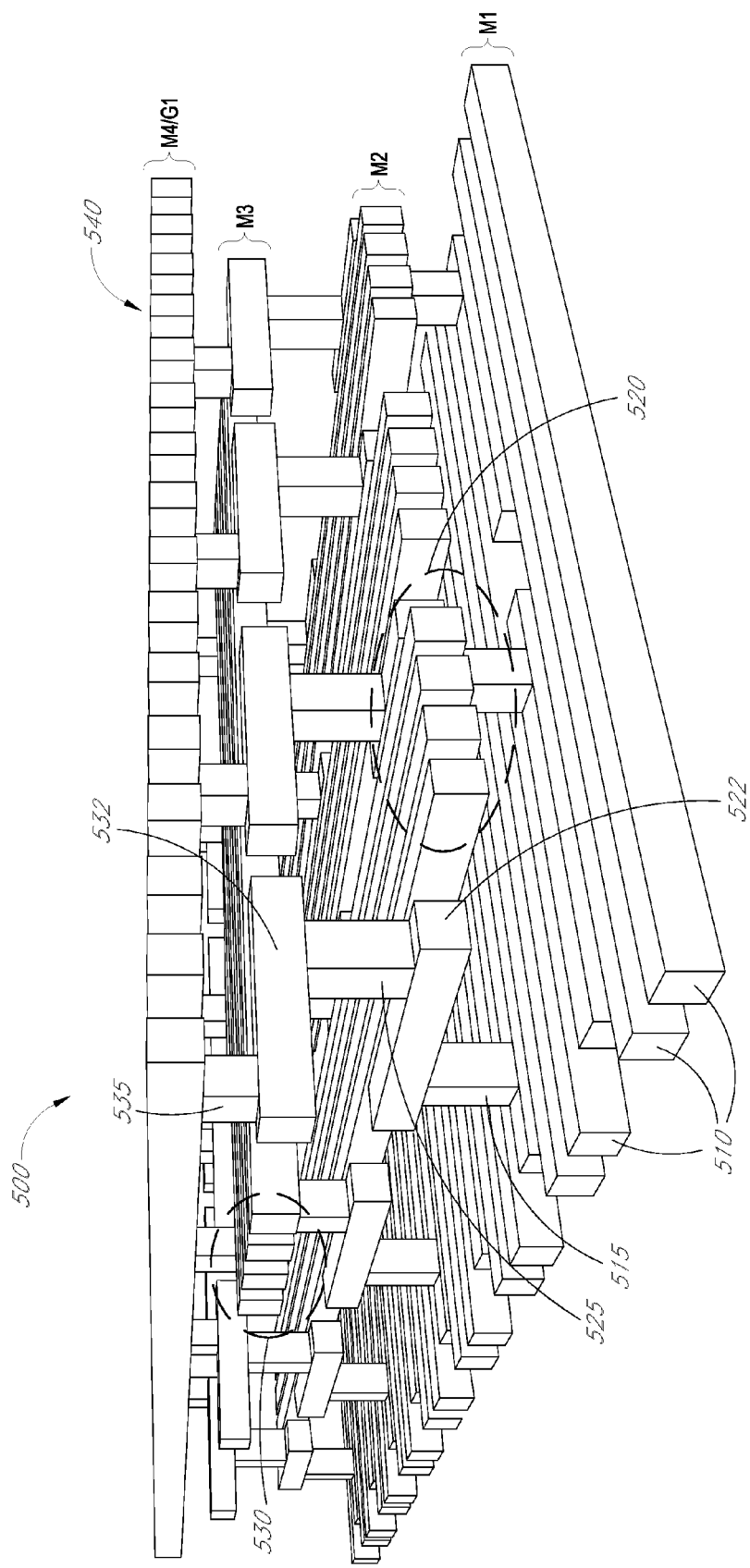
FIG. 5 is an illustration depicting a plurality of interconnect levels, according to an embodiment.

Referring to FIG. 5, since the driver groups are distributed throughout the area of the active array (along with sockets), an efficient method of connecting and driving these circuits is provided. The skilled artisan will appreciate, however, that the illustrated metallization scheme has application to interconnections for integrated circuits generally. FIG. 5 is an isometric illustration depicting a portion of an example metallization scheme 500 with a plurality of metal levels. In general, metal levels in a semiconductor can be referred to numerically starting at a metal level one (M1) and incremented with each additional metal layer. The embodiment of FIG. 5 includes four metal layers, M1, M2, M3 and M4, where M4 can also be referred to as a glue layer G1. As noted above, the term "glue layer" is employed herein to describe a metal layer that serves as an interface to form connections between lower metal layers (e.g., that interconnect driver circuits) and upper metal layers (e.g., forming part of a memory array); however the principles and advantages of the metallization scheme 500 of FIG. 5 are more generally applicable outside the environment of vertically integrated drivers and memory arrays, such that the more general term M4 can be used in this description. As also noted above, M1 can serve as a local interconnect for interfacing with semiconductor regions and for strapping semiconductor diffusion regions, whereas M2 and M3 can serve as longer distance interconnects.

A plurality of conductive lines 530 are depicted as implemented in the M3 metal level. A plurality of conductive lines 520 are also depicted as implemented in the M2 metal level. Further, a plurality of conductive lines 510 are depicted as implemented in the M1 metal level. A plurality of conductive lines 540 are depicted as implemented in the M4 metal level. In the illustrated embodiment, the conductive lines in each of the M1, M2, M3 and M4 metal layers are parallel with one another within each level and cross with (e.g., are orthogonal with) conductors in the adjacent levels. This simplifies the design layout of each of the individual metal layers. For example, photolithography optics can be optimized more easily for parallel lines as compared to more complicated patterns, allowing for the smallest line widths and spacings for a given lithography technique. Note, however, that the parallel line arrangement within one level can be limited to regions of the array, rather than maintained across the whole integrated circuit or across the whole array, as will be better understood from the description of FIG. 6 below. Furthermore, the parallel arrangement can be implemented by way of predominantly parallel lines within a given region, wherein the pattern includes parallel lines in central portions of the region with some deviations from parallel at the periphery of the region.

A plurality of electrically conductive vertical connectors are also depicted in FIG. 5. For example, a vertical connector 535 may provide an electrically conductive connection between a conductive line in M3 and a conductive line in M4. Similarly, a vertical connector 525 may provide an electrically conductive connection between an M2 line and an M3 line. A vertical connector 515 may also provide an electrically conductive connection between an M1 line and an M2 line. The vertical connectors may comprise one or more electrically conductive materials, such as polysilicon, tungsten, and/or copper, for example.

In one embodiment, one or more of M4/G1 conductive lines 540 may connect with a memory array (not shown) by way of one or more electrically conductive vertical connectors (also not shown). Also, one or more of M1 conductive lines 510 may connect with one or more drivers, such as word line drivers and/or bit line drivers.

To route an electrical signal from one metal level to a different location of a different metal level, relatively short lines, referred to as "paddles," may be implemented in intermediate metal layers, as depicted in FIG. 5. For example, to route a signal from an M1 line 510 to an M3 line 530, an M2 paddle 522 may be utilized to route an electrical signal between a connector 515 at one end of the paddle 522 and a connector 525 at another end of the paddle, thereby providing a conductive path for routing an electrical signal from level M1 to level M3. Each paddle 522/532 of M2/M3 is shorter than the conductive lines 520/530 of those levels. For example, each paddle 522/532 may have a length between about 10 F and 128 F, if F represents the technology node for the integrated circuit, typically also representing the narrowest line width and spacing between lines for the integrated circuit. In contrast, the conductive lines 520/530 of M2/M3 may have a length between about 200 F and several thousand times F, and may span the entire region (e.g., an electrode driver region). It will be understood that a paddle 522 in M2 permits the routing path for a signal to overpass conductive lines 510 of M1, thus permitting those conductive lines 510 to pass straight through and area in which vertical connections (with horizontal jogs) are made. Similarly, a paddle 532 in M3 permits the routing path for a signal to overpass conductive lines 520 of M2, thus permitting those conductive lines 520 to pass straight through a region in which vertical connections (with horizontal jogs) are made.

Note that M2 paddle 522 runs substantially in parallel with a number of other M2 lines 520. Note also that paddles run co-linear with other paddles in the same level, i.e., multiple short paddles extend along the same linear "track." Thus, each metal level is patterned predominantly with parallel conductive lines, at least across a given region, and each metal level has parallel lines that are oriented non-parallel with (e.g., are orthogonal to) the parallel lines of vertically adjacent metal levels. Thus within a region (e.g., a word line driver region or a bit line driver region), each "track" or patterned line of a given metal level is allocated to longer distance connections or to shorter paddles. Multiple tracks on each level can be allocated to paddles. This same strategy can be employed in an orthogonal direction for the adjacent metal levels above or below a given metal level. Accordingly, an efficient use of the available metallization is achieved within any given driver group.

A method of operating an integrated circuit can include routing a signal from a first semiconductor device to a second semiconductor device by way of a relatively short (e.g., between about 10 F and about 128 F) paddle. The signal can be routed through a paddle in an intermediate metal level to a long distance line on another metal level, where the long distance line is longer than the paddle. The first semiconductor device can be a transistor at a substrate level, and the signal can be routed through the paddle on one level and the longer distance line on another level to a second semiconductor device. As an example, CMOS driver circuitry may call for an interconnect between an n-transistor and a p-transistor of the same driver region that are a relatively long distance apart (e.g., between about 200 F and several thousand times F). Attempts to use M2 alone to form that connection would interfere with longer conductive lines 520 of the same metal level and interfere with the predominantly parallel arrangement in that region. In this example, both the first and second semiconductor devices can be transistors in an electrode driver circuit. In another example, the first semiconductor device can be a transistor at a substrate level and the second semiconductor device can be a memory cell (e.g., switch or storage device) in a memory array above the interconnect metal levels. As will be better understood from the description of FIG. 6 below, the signal can be repeatedly shunted between metal levels as the signal route crosses boundaries, e.g., boundaries between driver regions of different types.

Accordingly, FIG. 5 shows a single region of a semiconductor device. Within that region, each of at least two or at least three different metal levels (four shown) have predominantly parallel lines, some of which (conductive lines) are longer and some of which are shorter (paddles). The parallel lines of each level cross with (e.g., are orthogonal to) the parallel lines of a vertically adjacent level, such that the line orientations alternate with each vertical level.

An application for the metallization scheme of FIG. 5 to an example of distributed driver architecture is described below and illustrated in FIG. 6. It will be understood, however, that the metallization scheme of FIG. 5 has applications beyond the particular example of FIG. 6.

Figure 6:
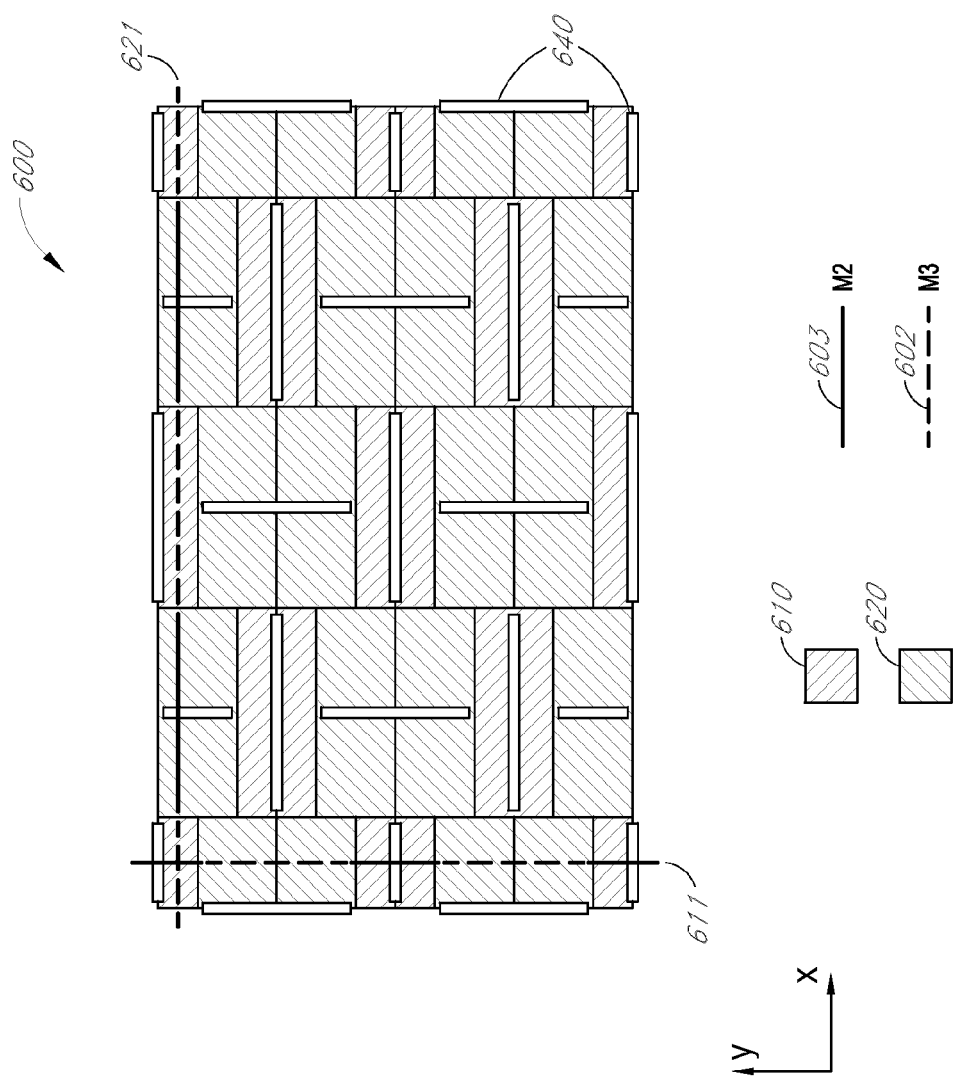
FIG. 6 is an illustration depicting a top view of a portion of an example implementation of a memory device comprising driver circuitry distributed across a memory array footprint in a quilt pattern.

FIG. 6 is an illustration depicting a top view of a portion of an example implementation of a memory device 600 comprising driver regions, such as bit line driver regions 610 and/or word line driver regions 620, arranged in a quilt pattern. The quilt architecture of FIG. 6 is similar to that of FIG. 4A, modified by expanding the word line driver regions 620 to border with the bit line driver regions 610, and the word line driver region are larger that the bit line driver regions due to greater real estate demands. Like FIGS. 3A and 4A, the column drivers, represented by bit line driver regions 612 in FIG. 6, are elongated in the row or x-direction. Like FIG. 4A, a signal path traversing a path in an x- or y-direction passes over several row and column driver regions alternately.

In the illustrated implementation, word line driver regions 620 and/or bit line driver regions 610 are broken up and redistributed, relative to peripheral driver arrangements such as FIGS. 2A-2B, in a manner such that a plurality of word line driver subsections are interspersed with a plurality of bit line driver subsections, for example. Also, in an implementation, socket regions 640 at which electrical connections may be made to a memory array may be located at word line driver subsections and/or bit line driver subsections evenly or unevenly interspersed throughout the quilt pattern. In the illustrated arrangement the socket regions 640 are each centered within the driver regions 610 and 620, minimizing distances from the socket regions 640 to the driver circuits. In an example implementation, connections from drivers in the regions 610 and/or 620 to an overlying memory array may be made by way of one or more metal levels formed between drivers in the regions 610 and/or 620 and the memory array. This approach may also be used for driving signals that are common between drivers and therefore crosses multiple driver region and tile boundaries.

The memory device 600 can include a metallization scheme with multiple metal levels, such as M1, M2, M3 and M4. Within each driver region 610, 620, the metallization can resemble FIG. 5, with predominantly parallel lines at each level, and the lines of each level crossing with (e.g., running perpendicular to) the lines of adjacent levels. However, because the desired orientations for lines of the lowest metal level M1 differ between word line driver regions 620 and bit line driver regions 610, the entire metallization stack can be rotated 90° at boundaries between different regions 610 and 620. Thus, M1 lines in a bit line driver region 610 are orthogonal to M1 lines in an adjacent word line driver region 620; M2 lines in a bit line driver region 610 are orthogonal to M2 lines in an adjacent word line driver region 620; etc.

In some implementations, a memory device may comprise a semiconductor level, such as silicon, including one or more word line driver regions 620, and/or one or more bit line driver regions 610. A memory device may further comprise one or more first signal paths 611, positioned substantially along a first direction. As shown, the first signal path 611 crosses over multiple alternating different driver regions 610 and 620. Because any given metal level has orthogonal lines from bit line region 610 to word line region 620, the one or more first signal paths substantially alternate between a first metal level, such as M2 602, and a second metal level, such as M3 603, positioned above a semiconductor level at least in part in accordance with the arrangement of drivers. An example implementation of a memory device may also comprise one or more second signal paths 621, oriented to cross with (e.g., orthogonal to) the first direction, wherein one or more second signal paths may alternate between metal levels, such as a M3 603 and M2 602, as they cross over correspondingly different circuit regions, such as the distributed word line driver regions 620 and bit line driver regions 610 of the illustrated embodiment. In the illustrated embodiment, the first signal paths 611 (extending in the y direction) are defined in metal level M2 over word line driver regions 610, but are defined in metal level M3 over bit line driver regions 620. In contrast, the second signal paths 621 (extending in the x direction) are defined in metal level M3 over word line driver regions 610, but are defined in metal level M2 over bit line driver regions 620. Accordingly, the first and second signal paths 611 and 621 do not interfere with each other where they cross over, nor do they interfere with other conductive lines defined in M2 and M3 for the interconnecting the distributed driver circuitry.

Accordingly, a signal path can alternate between metal levels to continue to travel in one direction (e.g., x-direction or y-direction) while crossing boundaries at which there is a switch in the orientations of parallel lines in a single metal level. Shunting of the signal paths 611 and 621 between metal levels can be facilitated by short metal lines, such as the paddles 522 or 532 of FIG. 5, without deviation from the parallel line arrangement for any given metal level within a given electrode driver region 610 or 620.

As noted, the metal level that interfaces with the semiconductor devices in the driver regions (e.g., M1) can have a parallel line or "routing track" orientation chosen to enable efficient connection for a word line driver group within a word line driver region 620. However, the direction of the routing tracks may be changed for that metal level grouping bit line driver regions 610, in which M1 interconnect to the bit line drivers may be orthogonal to the M1 interconnects to the word line drivers. In this way, a metallization structure will change direction at boundaries of driver regions that interconnect to semiconductor devices and drive in orthogonal directions. Thus to enable a signal to travel across multiple driver regions, in the x-direction, the same electrical signal will transition from one metal level to another as it crosses different driver regions. In a similar manner, a signal that travels in the y-direction will transition metal levels as it crosses the different driver regions. This organization of routing tracks, paddles and orthogonal conductors as described herein enables efficient use of the metal levels. The metallization scheme described herein is particularly, but not exclusively, useful for the distributed driver memory architectures of FIGS. 3A-4B and 6.

Figure 7A:
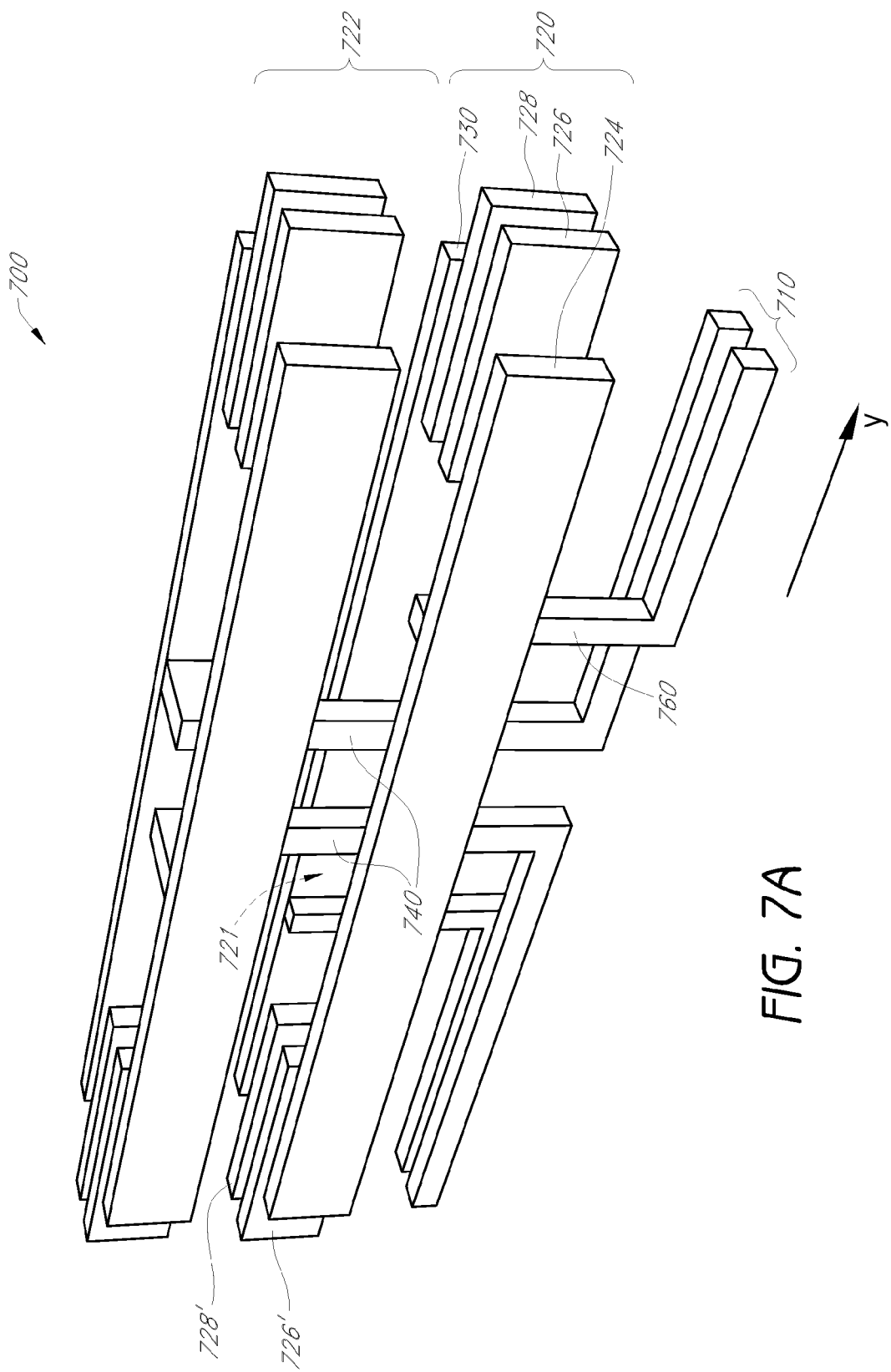
FIG. 7A is an isometric illustration depicting electrodes of a socket region for forming vertical connector among and through multiple metal levels, including an interconnect level and two levels of word lines, according to an embodiment.

FIG. 7A is an isometric illustration depicting three metal levels. In particular, an interface between a lower interconnect metal level and a higher memory array metal levels is illustrated. The lower interconnect metal level of the illustrated embodiment includes conductive lines 710 of the glue layer M4/G1 of FIG. 5 and the higher memory array metal levels include memory array electrode lines. In the illustrated embodiment, the electrode lines are represented by two levels of row electrodes in the form of word lines 720 and 722. The memory storage elements and bit lines are not shown for clarity, but it will be understood that similar socket regions can be employed for connecting interconnects to central points along column electrodes, or bit lines, rather than near the ends of such memory electrode lines. The memory may comprise a PCM cross-point memory array, although claimed subject matter is not limited in this respect.

Socket interconnect region 700 is a region of the memory device where vertical connections are made between the memory array electrodes and lower levels. The socket interconnect region 700 may comprise the socket for a two-deck memory array, comprising, for example, a first plurality of word line electrodes 720 and a second plurality of word line electrodes 722. In operation electrical signals may be communicated between the word lines and a plurality of word line drivers through the plurality of interconnect metal levels, including glue level G1. Some G1 conductive lines 710 electrically connect with word line electrodes 720 of the lower deck through vertical connectors 760 and other G1 conductive lines 710 connect to word line electrodes 722 of the upper deck by way of vertical connectors 740. Note that, despite the appearance of FIGS. 3A, 4A and 6, the location of the socket interconnect region 700 need not vertically align with the location of the interconnect socket (e.g., 640 in FIG. 6) for the drivers that are connected to the illustrated word lines 720 and 722. The connection point to the electrode lines can be laterally shifted with respect to the connection point to the driver regions, as they are connected by way of multiple interconnect levels (e.g., M1-M4).

It is noted that the vertical connectors between electrodes 710 of the glue level G1 and word line 722 can be routed through a gap 721 that is formed in neighboring word lines 720 in the same level. As explained above with reference to FIG. 4A, the staggered pattern of the word line electrodes, or group of electrodes, can create gaps 721 between the ends of word lines that correspond to the center location of adjacent word lines, as illustrated in FIG. 7A. In particular, a gap 721 is formed in the region between ends of two terminated word line electrodes 726 and 728 and ends of terminated word line electrodes 726' and 728' on the other side of the gap 721, which creates room for vertical connectors 760 to adjacent word line electrodes 724 and 730 on the same metal level, as well as for vertical connectors 740 to word line electrodes 722 of a higher metal level or higher 'memory deck.' The terminated words lines 726, 726' and 728, 728' are aligned in the illustrated embodiment. These gaps 721, as shown in FIG. 7A, provide a path to route the vertical connectors 740 and 760.

Figure 7B:
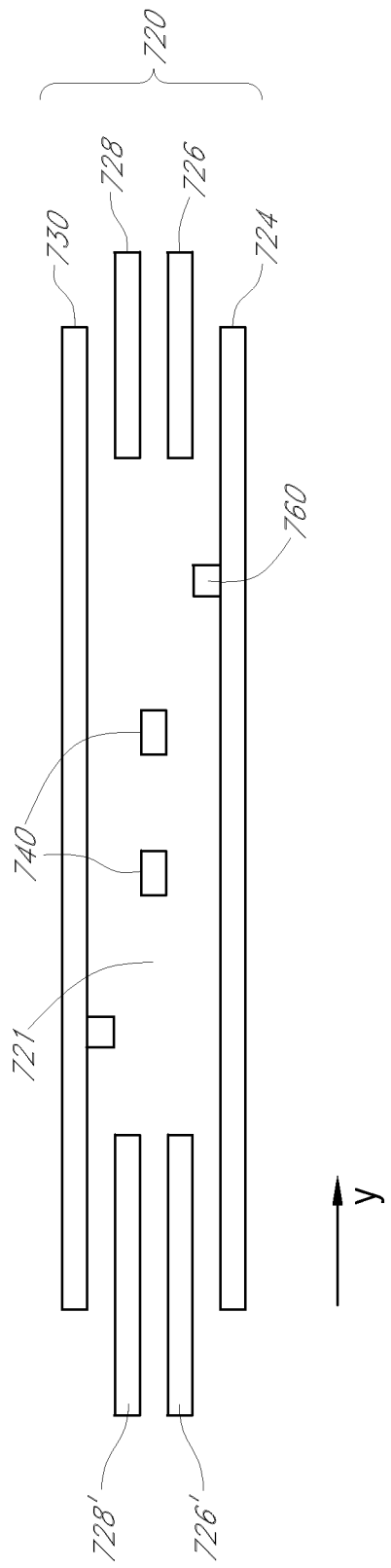
FIG. 7B is an illustration of a top view of one of the levels of word lines and the vertical connectors of FIG. 7A.

FIG. 7B illustrates a top view of word lines 720 of FIG. 7A and vertical connectors 740 and 760. In an implementation, inter-level vertical connectors 760 may extend from central points along word lines 724 and 730 to other vertical levels, such as points along one or more conductive lines 710 in the glue level G1 (FIG. 7A). While shown as connecting to the sides of word lines 724 and 730, it will be understood that the vertical connectors 760 can instead connect to the bottom surfaces of the words lines 724 and 730. As previously noted, in some implementations, the connection points between the vertical connectors 760 and the word lines 724 and 730 is closer to mid-points along the word lines 724 and 730 than to either end point of the word lines 724 and 730. In some implementations, the connection point are positioned a distance of at least about 40% of the length of the word line from either end of the word line, such that the connection point is within the middle 20% of the length of the line. The sockets and central connections can be similar for sockets for the bit lines (not shown)

Also, vertical connectors 740 may extend from lower levels, such as points along one or more conductive lines 710 in the glue level G1 (FIG. 7A) to one or more upper deck word lines 722 (FIG. 7A). Gaps 721 may be located in spaces between word lines, such as lower-deck word lines 726 and 728 and aligned word line 726' and 728'. The number of terminating lines may change to enable more or less room to allow vias to pass through as required by the process. As will be better understood from the description below of FIG. 8B, sockets can alternatively be created in regions between ends of terminated lines, but the lines terminated at the sockets need not be aligned with one another FIGS. 7A and 7B illustrate the concept of connections to the array without regard for the individual processing steps or layers for forming those connections. The concept is general in that it can be extended or simplified to support the requirements for word line sockets, bit line sockets and sockets for support of multiple decks of a 3D memory array. The illustration depicts a socket that may be built with direct print technology, where a masking process defines the actual line or space of the word line or bit line electrode. The quilt socket, defined in gaps between terminations or ends of electrode lines, allows electrical connectors (e.g., vertical connectors 760) to terminate at the socket, and space is available within the socket to connect to electrode lines that do not terminate at the socket (pass adjacent or through the socket region) by means of a contact via or other connection. Additionally, some electrical connectors (e.g., vertical connectors 740) can pass through electrically unimpeded through the socket, e.g., to connect with electrode lines at a different vertical level, such as for a multideck or multilevel memory array.

With reference to FIGS. 8A and 8B, these criteria can also be met in the context of self-aligned double patterning (SAPD), which is a technique for pitch-multiplication. FIG. 8A shows an example of a pattern of sacrificial mandrels 800 that can be defined by a masking process, such as photolithography. The mandrels 800 can be directly formed by lithography or can be formed by a masking process that transfers the pattern from upper resist patters to lower hard mask material(s). In the illustrated embodiment, the sacrificial mandrels 800 include elongated pass-through mandrel lines 805, terminated mandrel lines 806, transverse mandrel jogs 810 and isolated mandrel features 815. In this case, including the transverse mandrel jogs 810 along the patterned pass-through mandrel lines 805 facilitates line spacing for proper placement of the isolated mandrel features 815, which in turn can be used to pattern vias for vertical connections. The terminated mandrel lines 806 are not aligned but facilitate creation of room for the connections being made in the socket.

FIG. 8B shows a pattern of spacers that can be obtained by forming sidewall spacers over mask or hard mask features having the pattern of the sacrificial mandrels 800 of FIG. 8A, and that spacer pattern, or the negative image of it, can also represent a pattern of memory electrode lines 850 patterned by use of the spacers as a hard mask. Spacers can be formed by a conformal thin film deposition over the mandrels 800, followed by anisotropic etch to remove horizontal portions of the film and leave the spacers on the vertical sidewalls of the mandrels 800, after which the mandrels 800 can be removed by selective etching. These spacers can then be used to pattern metal lines to form the illustrated pattern of memory electrode lines 850.

The memory electrode lines 850 include pass-through electrode lines 855, which include electrode jog segments 860 that extend transverse to the direction of electrode elongation, and terminated electrode lines 856. The pass-through electrode lines 855 of the illustrated embodiment are adjacent to the terminated electrode lines 856, like the embodiment of FIGS. 7A-7B, and pass through the interconnect socket region. In the case of FIG. 8B, the interconnect socket region is formed in a gap between ends of terminated electrode lines 856 that do not align. The electrode lines 855 and 856 have double the density of the mandrels lines 805 and 806 because two spacer lines forming these electrode lines 855 or 856 are formed on opposite sidewalls of each mandrel line 805 or 806. It will be understood that two spacer lines as formed also connect to one another as formed by looping around the end of a mandrel line 805 or 806. However, an additional chopping mask can be employed to cut off the spacer loop ends and prevent shorting of the eventual conductive lines. For example, boxes 857 can represent openings in a chopping mask through which etchant can cut off the spacer loop ends. Alternatively, boxes 857 can represent a blocking mask that covers the loop ends and serves to prevent transfer of spacer loop end parts of the spacer pattern when transferring the spacer pattern to a lower level, e.g., to another hard mask level or into an interlevel dielectric when conducting damascene patterning. Similar boxes 859 can represent chopping or blocking mask features that provide two isolated spacer features that can used to define two vertical connectors 865 for every one isolated mandrel feature 815.

In different embodiments, each of the memory electrode lines 855 and 856 can represent a row electrode (e.g., word line) or a column electrode (e.g., digit or bit lines), defined by spacers formed over the mandrel pattern 800 of FIG. 8A (e.g., using the spacers as a hard mask to pattern a blanket metallic layer, or to pattern an insulator for a damascene process). Each isolated spacer feature can represent the location of a pass-through vertical connector 865. In FIG. 8B, the pass-through vertical connectors 865 do not contact the electrode lines 855 and 856 of the illustrated electrode level. Rather, the pass-through vertical connectors 865 can connect lower levels (e.g., G1 glue electrodes, ultimately electrically connected to electrode drivers) to upper levels (e.g., electrodes of a memory array upper deck), and simply pass through the level of the electrodes represented by the electrode lines 855 and 856. The vertical connectors 865 can connect with electrode line of the memory array in the upper levels at central locations along the electrode lines, as described above.

Thus FIGS. 7A-8B demonstrate the concept of socket interconnect regions for vertical connectors to electrodes, such as connections from lower level drivers to memory electrode levels and/or through an intervening level of electrodes to upper level electrodes. The socket interconnect regions can be employed solely for vertically connectors to the electrodes at the electrode level of the socket region; solely for pass-through vertical connectors without electrically contacting the intervening level of electrodes (see isolated spacer features in FIG. 8B); or for both pass-through connectors and connectors that terminate at the intervening level (see vertical connectors 740 and 760 in FIGS. 7A-7B). Connections can be made at central locations of electrode lines. Accordingly, connections for driving electrodes can be made in the midst of an array of electrode lines for a memory array, rather than being limited to peripheral locations, and average or maximum lateral distances from each driver to its associated memory cells can be minimized. The socket interconnect regions can be defined by gaps between terminations or ends of electrode lines that are aligned (FIG. 7B) or by gaps defined between terminations or ends of electrode lines that are not aligned (FIG. 8B). For example, none of the terminated spacer lines 856 of FIG. 8B are aligned, but it can be seen how they nevertheless define a gap along the direction of elongation in the region between the terminations. Vertical connectors can be made in those gaps to electrode lines that are adjacent or bordering on gap (FIG. 7B) and/or to adjacent electrode lines that run through the gaps (FIG. 8B). For example, in FIG. 8B vertical connectors (not shown) can connect to the underside of the transverse electrode jog segments 860 within the socket interconnect region.

While the pitch multiplication technique of FIGS. 8A-8B has been described in terms of spacers on sacrificial mandrels, the skilled artisan will appreciate that pitch multiplication can be achieved using other techniques. For example, and without limitations, the spacer process can be conducted twice to achieve four times the density and one quarter line width as compared to lithography-defined features; non-spacer processes can be performed, such as repeating a lithographic process twice with a lateral shift between masks; etc.

For the distributed driver and staggered electrode arrangements of FIGS. 3A, 4A and 6, it will be noted that a distinct memory cell address tile does not necessarily correspond to the physical boundaries of the sub-array tiles. The distributed nature of the drivers and sockets and the overlapping nature of the electrodes means that there is no longer a natural correlation between driver group location and location of a corresponding driven memory cell array. Thus a memory cell address decoding strategy should take into account the overlap in order to avoid unintended selection of bits in the array. If a word line is 1 k bits in extent and a bit line is 1 k bits in extent, then the tile is the group of drivers needed to uniquely drive 1K×1K bits. In the illustrated distributed arrangements, this group of drivers is generally located over a footprint that is different from the physical location of the bits which it addresses. In other words, even though a memory array can overlie and thus share real estate with its word line drivers and bit line drivers, the locations of the drivers need not correspond to the locations of the memory cells that they address.

Accordingly, a collection of such tiles can drive array word line electrodes and bit line electrodes that extend beyond the boundary of these tiles. Similarly, any collection of these tiles can have word line and bit line electrodes that extend into the regions occupied by these tiles from outside the boundary of those regions. For example, with reference to FIG. 4A, the word line driver regions 410 in the lower left corner of the array is shown driving a word line 430 that extends to the right to terminate above a different word line driver region 410. Moreover, that centrally connected word line 430 is also shown extending to the left, which may be outside the footprint of the memory array and thus partially orphaned from memory cells. Conversely, the staggered arrangement will generally result in memory cells that are orphaned from word line or bit line drivers. The flexible nature of the metallization scheme enables matching of orphaned drivers in one part of the array with orphaned memory cells in another part of the array.

Figure 10:
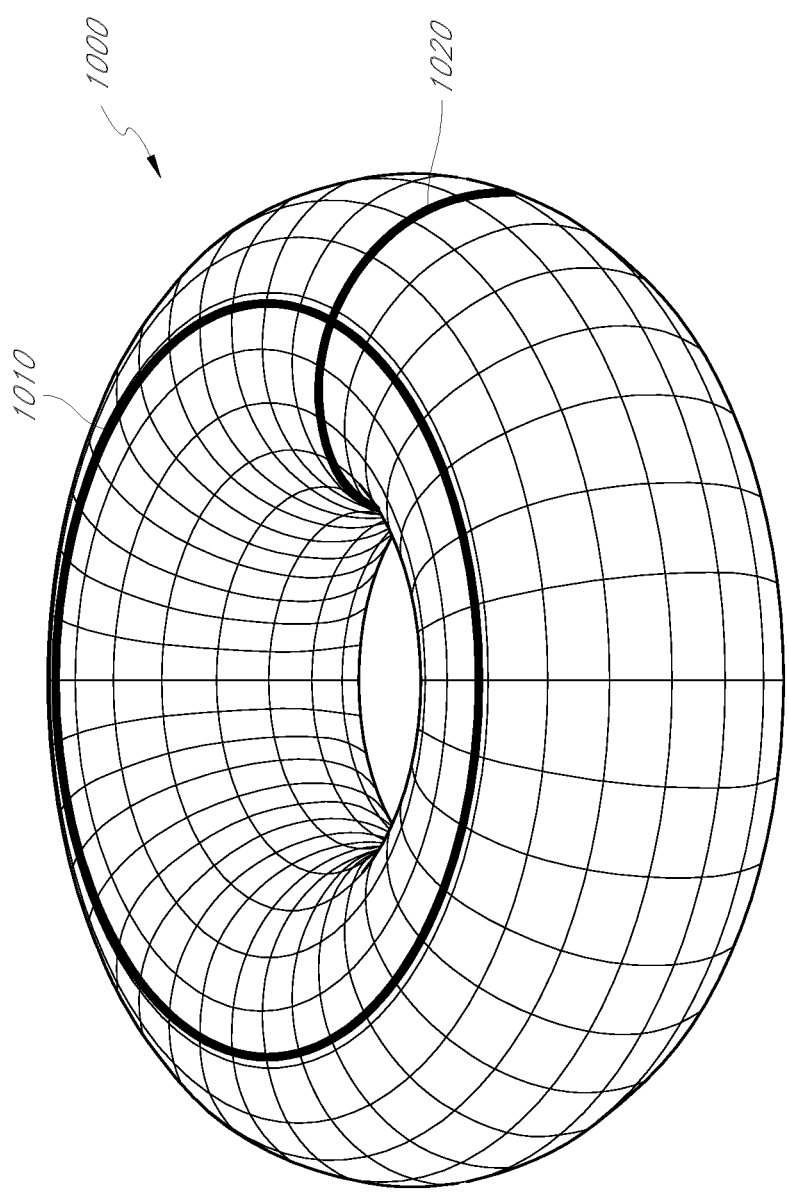
FIG. 10 is an illustration of a torus to represent a relationship between memory cell locations and electrode that address them for an arrangement of distributed drivers and staggered electrode lines, according to an embodiment.

Accordingly, because locations of memory cells need not correspond to locations of the driver circuitry that addresses those cells. The staggered arrangement of the row and column electrode lines particularly leads to dangling electrode lines at the periphery of the array. However, because the orphaned cells and drivers on one end of the array can be matched with the orphaned cells and drivers on the opposite edge of the array, the resultant connections electrically behave as if electrode lines on one edge of the array wrap around a cylindrical shape to address memory cells on the opposite edge of the array. The extension of electrode lines to connect with memory cells above adjacent tiles represents meshing of adjacent tiles, and peripheral tiles can mesh with tiles on opposite sides of the array to make a continuous mesh. Because this logical "wrap" effect applies in both dimensions of row electrodes and column electrodes, the array of memory cells and the electrodes that address them can be logically represented on the surface of a torus 1000 as illustrated in FIG. 10 showing a group of word lines 1010 and a group of bit lines 1020. Word line group 1010 represents a collection of word line segments or groups of segments that may be staggered from each other, such as the illustrated group of four word lines 430 shown in FIG. 4A that gets repeated for adjacent tiles. Similarly bit line group 1020 represents a collection of bit line segments or groups of segments, such as the illustrated group of four bit lines 432 shown in FIG. 4A that gets repeated for adjacent tiles. Electrodes that extend outside the tiles on the upper boundary of the collection of tiles, matches the electrodes that extend into the bottom boundary of the tiles. Similarly, electrodes that extend into the left boundary of a tile match the electrodes that extend into the right boundary of that tile. To achieve mapping of this logical toroidal surface onto the planar surface of a silicon wafer, some duplication of decoding circuits may be entailed. Any such decoding overhead can be amortized over a collection of contiguous tiles or patches.

CONCLUSION

Embodiments herein provide for row and column drivers, optionally along with other logic circuitry for memory management, in row and column driver regions within a shared footprint of a memory array, e.g., below the memory array. Disjointed driver regions can be distributed across the footprint, and connections from drivers to the row and column electrode lines (e.g., word and digit lines) can also be distributed across the footprint. The distribution can resemble and patchwork or quilt pattern. Bringing logic circuitry within the footprint of the memory array can save footprint and circuit complexity both by reducing real estate traditionally occupied by "peripheral" circuitry and by shortening the distance from the logic circuitry to the memory cells, thus relaxing specifications for the logic circuitry. Because the real estate needs of logic circuitry can exceed those of the memory array served by it, particularly (but not exclusively) for multi-deck memory arrays, the arrays need not be scaled to be smaller in size than the underlying logic circuits. Accordingly, further savings can be obtained by scaling the memory array only as much as needed to cover the distributed logic circuitry below. The critical dimensions of the memory array can thus also be more relaxed, and less expensive patterning processes can be employed compared to cutting edge technology.

Metallization schemes described herein can facilitate connecting the distributed logic circuits to overlying memory array(s); however, the metallization scheme can also be employed independently of the logic circuit placement, and independently of interconnect socket designs described herein. The metallization schemes can include maintaining parallel lines within a particular region at a particular metal level, and maintaining parallel lines that cross (e.g., perpendicularly) with those lines in adjacent metal levels. Such a parallel arrangements at each level are efficient from a lithography point of view. The crossing orientations can alternate from level to level within the region. The parallel lines can include both long distance lines and comparatively shorter paddles, where multiple paddles can be co-linear along same track. As an example, paddle length can be 10 F and 128 F, where F represents the narrowest line width in the integrated circuit, whereas long distance line can have a length from about 200 F to thousands times F. In operation, such paddles can be used to route signals between lower and higher levels, shifting the signal path by a relatively short distance to a longer crossing line longer in another interconnect level. Signals can thus be shunted in various directions without deviating from the parallel arrangement within a region on a metal level.

Interconnect socket designs described herein can facilitate connecting the distributed logic circuits to overlying memory array(s); however, the interconnect sockets can also be employed independently of logic circuit placement, and independently of metallization schemes with alternating parallel lines. Interconnect socket regions can be formed in gaps between the ends of terminated memory electrode lines in the same level (e.g., row or column electrode lines), and vertical connectors make contact with non-terminated lines that pass through or by the socket interconnect regions. Memory electrodes can be staggered in either or both row and column directions, and connections to electrode lines in the interconnect socket regions can be made at central points along the lengths of the electrode lines. Among other benefits, driving memory electrodes from central points and staggering the lines ensures that an addressed cell cannot be both farthest away from its column driver and farthest away from its row driver.

Systems including the memory devices described herein can additionally include one or more processors in communication with the logic circuitry of the memory devices. Such systems can additionally include components to define electronic devices, such as, but not limited to, computers, mobile phones, electronic games, cameras, music players, etc.

The terms, "and", "or", and "and/or" as used herein may include a variety of meanings that also are expected to depend at least in part upon the context in which such terms are used. Typically, "or" if used to associate a list, such as A, B or C, is intended to encompass A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods or apparatuses that would be known by one of ordinary skill have not been described in detail so as not to obscure claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof.

The invention claimed is:

1. A memory device, comprising:
   an array of memory cells comprising a plurality of memory electrode lines extending in a first direction, the memory electrode lines being staggered to terminate at different positions along the first direction, the memory electrode lines including terminated electrode lines and terminating at a socket interconnect region and adjacent electrode lines that do not terminate at the socket interconnect region; and a vertical connector making contact with a contacted electrode line of the adjacent electrode lines within the socket interconnect region.

2. The memory device of claim 1, wherein the vertical connector contacts the contacted electrode line at a central region along the contacted electrode line.

3. The memory device of claim 2, wherein the vertical connector contacts the contacted electrode line at a point no more than about 40% of the length of the contacted electrode line from either end of the contacted electrode line.

4. The memory device of claim 2, further comprising a plurality of disjointed word line driver regions and a plurality of disjointed digit line driver regions distributed below the array of memory cells in a shared substrate footprint with the array of memory cells.

5. The memory device of claim 1, further comprising at least one pass-through vertical connector passing vertically through the socket interconnect region to electrically connect an interconnect metal level below the socket interconnect region with a memory electrode line in a level above the socket interconnect region.

6. The memory device of claim 5, wherein the memory device is a multi-deck memory device and the at least one pass-through vertical connector connects to an electrode line of a deck of upper electrode lines above the interconnect socket region.

7. The memory device of claim 1, wherein the interconnect socket region includes a gap formed between ends of aligned ones of the terminated electrode lines and the contacted electrode line extends along the first direction adjacent the gap.

8. The memory device of claim 1, wherein the interconnect socket region includes a gap is formed between ends of non-aligned ones of the terminated electrode lines and the adjacent electrode lines include pass-through electrode lines extending through the gap.

9. The memory device of claim 8, wherein the pass-through electrode lines include jog segments extending transverse to the first direction within the gap, wherein the jog segments each contact a vertical connector within the interconnect socket region.

10. The memory device of claim 9, further comprising at least one pass-through vertical connector passing vertically through the socket interconnect region to electrically connect an interconnect metal level below the socket interconnect region with a memory electrode line in a level above the socket interconnect region, the at least one pass-through vertical connector passing between two of the jog segments.

11. The memory device of claim 10, wherein the memory electrode lines comprise pitch multiplied electrode lines.

12. The memory device of claim 1, wherein the memory electrode lines are grouped in bundles, the bundles being staggered with respect to adjacent bundles.

13. The memory device of claim 1, wherein the memory electrode lines comprise word lines and the array of memory cell comprises a cross-point phase change memory array.

14. The memory device of claim 1, wherein the memory electrode lines comprise digit lines and the array of memory cells comprises a cross-point phase change memory array.

15. A system, comprising:
an array of memory cells having stored therein one or more data states;
a plurality of staggered row electrode lines for the array of memory cells, each of the row electrode lines being elongated in a first direction and staggered to terminate at different positions along the first direction, the row electrode lines including terminated row electrode lines terminating at a socket interconnect region and adjacent row electrode lines that do not terminate at the socket interconnect region; and
a plurality of row vertical connectors each contacting one of the row electrode lines at a central point along its length in the first direction.

16. The system of claim 15, wherein each of the row vertical connectors makes contact to a contacted row electrode line of the row electrode lines in a gap between ends of the terminated row electrode lines of the row electrode lines.

17. The system of claim 16, wherein the row electrode lines are grouped in bundles, wherein the bundles are staggered such that a first bundle including the terminated row electrode lines terminates at the gap and a second bundle including the adjacent row electrode lines adjacent the first bundle extends adjacent the first bundle and does not terminate at the gap.

18. The system of claim 17, wherein the second bundle extends through the gap.

19. The system of claim 18, wherein the second bundle includes horizontal segments within the gap, the horizontal segments being transverse to the first direction.

20. The system of claim 19, wherein the array of memory cells is a multideck array, further comprising a pass-through vertical connector extending vertically through the gap without contacting the row electrode lines.

21. A system, comprising:
an array of memory cells having stored therein one or more data states;
a plurality of staggered row electrode lines for the array of memory cells, each of the row electrode lines being elongated in a first direction;
a plurality of row vertical connectors each contacting one of the row electrode lines at a central point along its length in the first direction;
a plurality of the staggered column electrode lines for the array of memory cells, each of the column electrode lines being elongated in a second direction crossing with the first direction; and
a plurality of column vertical connectors each contacting one of the column electrode lines at a central point along its length in the second direction.

22. A method for accessing one or more memory cells of a memory array, comprising:
selecting a row electrode among a plurality of row electrode lines of the memory array at least in part by applying a row driver signal to central point along a length of the row electrode in the memory array, the plurality of row electrode lines extending in a first direction and staggered to terminate at different positions along the first direction; and
selecting a column electrode of the memory array at least in part by applying a column driver signal to a central point along a length of the column electrode in the memory array.

23. The method of claim 22, further comprising programming a phase change memory cell at an intersection of the row electrode and the column electrode.

24. The method of claim 22, wherein selecting the column electrode includes selecting a column electrode among a plurality of column electrode lines, wherein the plurality of column electrode lines extend in a second direction crossing the first direction and staggered to terminate at different positions along the second direction.

25. A method for accessing one or more memory cells of a memory array, comprising:
selecting a row electrode of the memory array at least in part by applying a row driver signal to central point along a length of the row electrode in the memory array, wherein the applying the row driver signal to the central point of the row electrode comprises applying the row driver signal to an electrically conductive vertical connector connected to the central point of the row electrode, the vertical connector positioned in a gap formed between ends of terminated row electrodes adjacent to the row electrode; and
selecting a column electrode of the memory array at least in part by applying a column driver signal to a central point along a length of the column electrode in the memory array.

26. The method of claim 25, wherein the applying the row driver signal to the central point of the column electrode comprises applying the column driver signal to an electrically conductive second vertical connector connected to the central point of the column electrode, the second vertical connector positioned in a gap formed between ends of terminated column electrodes adjacent to the column electrode.

27. The method of claim 25, wherein selecting the column electrode includes the applying the row driver signal to the central point of the row electrode comprises conducting the row driver signal between an interconnect line in a metallization level positioned below the memory array to the electrically conductive vertical connector.

28. The method of claim 25, further comprising selecting a second row electrode of an upper deck of the memory array at least in part by applying a second row electrode driver signal to a central point along a length of the second row electrode in the upper deck of the memory array.

29. The method of claim 28, wherein the applying the second row electrode driver signal to the central point of the second row electrode in the upper deck of the memory array comprises conducting the second row electrode driver signal to an electrically conductive second vertical connector connected to the central point of the second row electrode, the second vertical connector passing through the gap without contacting the row electrode or the terminated row electrodes.

* * * * *

UNITED STATES PATENT AND TRADEMARK OFFICE
CERTIFICATE OF CORRECTION

| | |
|---|---|
| PATENT NO. | : 8,891,280 B2 |
| APPLICATION NO. | : 13/651234 |
| DATED | : November 18, 2014 |
| INVENTOR(S) | : Hernan A. Castro et al. |

It is certified that error appears in the above-identified patent and that said Letters Patent is hereby corrected as shown below:

In the Claims

Column 24, lines 3-4, Claim 27, after "wherein" delete "selecting the column electrode includes".

Signed and Sealed this
Twenty-fourth Day of February, 2015

Michelle K. Lee
*Deputy Director of the United States Patent and Trademark Office*